(12) United States Patent
Kirby

(10) Patent No.: US 7,589,008 B2
(45) Date of Patent: Sep. 15, 2009

(54) METHODS FOR FORMING INTERCONNECTS IN MICROELECTRONIC WORKPIECES AND MICROELECTRONIC WORKPIECES FORMED USING SUCH METHODS

(75) Inventor: Kyle K. Kirby, Boise, ID (US)

(73) Assignee: Micron Technology, Inc., Boise, ID (US)

(*) Notice: Subject to any disclaimer, the term of this patent is extended or adjusted under 35 U.S.C. 154(b) by 259 days.

(21) Appl. No.: 11/418,170

(22) Filed: May 4, 2006

(65) Prior Publication Data

US 2006/0205211 A1    Sep. 14, 2006

Related U.S. Application Data

(62) Division of application No. 11/027,443, filed on Dec. 30, 2004, now Pat. No. 7,271,482.

(51) Int. Cl.
*H01L 21/44* (2006.01)
(52) U.S. Cl. .............. 438/612; 438/622; 438/637; 438/638; 438/666
(58) Field of Classification Search .......... 438/612, 438/618, 622, 637, 638, 666, 667
See application file for complete search history.

(56) References Cited

U.S. PATENT DOCUMENTS

| 2,821,959 A | 2/1958 | Franz |
| 3,006,318 A | 10/1961 | Monroe, Jr. et al. |
| 3,345,134 A | 10/1967 | Heymer et al. |
| 3,865,298 A | 2/1975 | Allen et al. |
| 4,368,106 A | 1/1983 | Anthony |
| 4,534,100 A | 8/1985 | Lane |
| 4,608,480 A | 8/1986 | Bizot et al. |

(Continued)

FOREIGN PATENT DOCUMENTS

EP        0127946        12/1984

(Continued)

OTHER PUBLICATIONS

Aachboun, S. and P. Ranson, "Cryogenic etching of deep narrow trenches in silicon," J. Vac. Sci. Technol. A 18(4), Jul./Aug. 2000, pp. 1848-1852.

(Continued)

*Primary Examiner*—Hsien-ming Lee
(74) *Attorney, Agent, or Firm*—Perkins Coie LLP

(57) ABSTRACT

Methods for forming interconnects in microelectronic workpieces and microelectronic workpieces having such interconnects are disclosed herein. One aspect of the invention is directed toward a method for manufacturing a microelectronic workpiece having a plurality of microelectronic dies. The individual dies include an integrated circuit and a terminal electrically coupled to the integrated circuit. In one embodiment, the method includes forming an opening in the workpiece in alignment with the terminal. The opening can be a through-hole extending through the workpiece or a blind hole that extends only partially through the substrate. The method continues by constructing an electrically conductive interconnect in the workpiece by depositing a solder material into at least a portion of the opening and in electrical contact with the terminal. In embodiments that include forming a blind hole, the workpiece can be thinned either before or after forming the hole.

18 Claims, 26 Drawing Sheets

U.S. PATENT DOCUMENTS

| | | | |
|---|---|---|---|
| 4,614,427 A | 9/1986 | Koizumi et al. |
| 4,660,063 A | 4/1987 | Anthony |
| 4,756,765 A | 7/1988 | Woodroffe |
| 4,768,291 A | 9/1988 | Palmer |
| 4,906,314 A | 3/1990 | Farnworth et al. |
| 4,959,705 A | 9/1990 | Lemnios et al. |
| 4,964,212 A | 10/1990 | Deroux-Dauphin et al. |
| 4,984,597 A | 1/1991 | McConnell et al. |
| 5,024,966 A | 6/1991 | Dietrich et al. |
| 5,026,964 A | 6/1991 | Somers et al. |
| 5,027,184 A | 6/1991 | Soclof |
| 5,037,782 A | 8/1991 | Nakamura et al. |
| 5,123,902 A | 6/1992 | Muller et al. |
| 5,130,783 A | 7/1992 | McLellan |
| 5,145,099 A | 9/1992 | Wood et al. |
| 5,158,911 A | 10/1992 | Quentin et al. |
| 5,233,448 A | 8/1993 | Wu et al. |
| 5,289,631 A | 3/1994 | Koopman et al. |
| 5,292,686 A | 3/1994 | Riley et al. |
| 5,294,568 A | 3/1994 | McNeilly et al. |
| 5,371,397 A | 12/1994 | Maegawa et al. |
| 5,378,312 A | 1/1995 | Gifford et al. |
| 5,402,435 A | 3/1995 | Shiono et al. |
| 5,406,630 A | 4/1995 | Piosenka et al. |
| 5,424,573 A | 6/1995 | Kato et al. |
| 5,435,887 A | 7/1995 | Rothschild et al. |
| 5,447,871 A | 9/1995 | Goldstein |
| 5,464,960 A | 11/1995 | Hall et al. |
| 5,496,755 A | 3/1996 | Bayraktaroglu |
| 5,505,804 A | 4/1996 | Mizuguchi et al. |
| 5,518,956 A | 5/1996 | Liu et al. |
| 5,585,308 A | 12/1996 | Sardella |
| 5,585,675 A | 12/1996 | Knopf |
| 5,593,913 A | 1/1997 | Aoki |
| 5,605,783 A | 2/1997 | Revelli et al. |
| 5,614,743 A | 3/1997 | Mochizuki et al. |
| 5,627,106 A | 5/1997 | Hsu et al. |
| 5,646,067 A | 7/1997 | Gaul |
| 5,654,221 A | 8/1997 | Cronin et al. |
| 5,672,519 A | 9/1997 | Song et al. |
| 5,673,846 A | 10/1997 | Gruber |
| 5,694,246 A | 12/1997 | Aoyama et al. |
| 5,708,293 A | 1/1998 | Ochi et al. |
| 5,718,791 A | 2/1998 | Spengler et al. |
| 5,723,904 A | 3/1998 | Shiga et al. |
| 5,771,158 A | 6/1998 | Yamagishi et al. |
| 5,776,824 A | 7/1998 | Farnworth et al. |
| 5,807,439 A | 9/1998 | Akatsu et al. |
| 5,811,799 A | 9/1998 | Wu |
| 5,821,532 A | 10/1998 | Beaman et al. |
| 5,825,080 A | 10/1998 | Imaoka et al. |
| 5,826,628 A | 10/1998 | Hamilton |
| 5,851,845 A | 12/1998 | Wood et al. |
| 5,857,963 A | 1/1999 | Pelchy et al. |
| 5,861,654 A | 1/1999 | Johnson |
| 5,877,040 A | 3/1999 | Park et al. |
| 5,893,828 A | 4/1999 | Uram |
| 5,897,338 A | 4/1999 | Kaldenberg |
| 5,904,499 A | 5/1999 | Pace |
| 5,914,488 A | 6/1999 | Sone |
| 5,977,535 A | 11/1999 | Rostoker |
| 5,998,292 A | 12/1999 | Black et al. |
| 5,998,862 A | 12/1999 | Yamanaka |
| 6,004,867 A | 12/1999 | Kim et al. |
| 6,008,070 A | 12/1999 | Farnworth |
| 6,080,291 A | 6/2000 | Woodruff et al. |
| 6,097,087 A | 8/2000 | Farnworth et al. |
| 6,103,547 A | 8/2000 | Corisis et al. |
| 6,104,086 A | 8/2000 | Ichikawa et al. |
| 6,107,679 A | 8/2000 | Noguchi et al. |
| 6,110,825 A | 8/2000 | Mastromatteo et al. |
| 6,114,240 A | 9/2000 | Akram et al. |
| 6,124,634 A | 9/2000 | Akram et al. |
| 6,133,622 A | 10/2000 | Corisis et al. |
| 6,137,182 A | 10/2000 | Hause et al. |
| 6,140,604 A | 10/2000 | Somers et al. |
| 6,143,588 A | 11/2000 | Glenn |
| 6,148,509 A | 11/2000 | Schoenfeld et al. |
| 6,159,764 A | 12/2000 | Kinsman et al. |
| 6,184,465 B1 | 2/2001 | Corisis |
| 6,187,615 B1 | 2/2001 | Kim et al. |
| 6,191,487 B1 | 2/2001 | Rodenbeck et al. |
| 6,222,270 B1 | 4/2001 | Lee et al. |
| 6,228,687 B1 | 5/2001 | Akram et al. |
| 6,229,202 B1 | 5/2001 | Corisis |
| 6,235,552 B1 | 5/2001 | Kwon et al. |
| 6,236,046 B1 | 5/2001 | Watabe et al. |
| 6,246,108 B1 | 6/2001 | Corisis et al. |
| 6,252,300 B1 | 6/2001 | Hsuan et al. |
| 6,259,083 B1 | 7/2001 | Kimura |
| 6,266,197 B1 | 7/2001 | Glenn et al. |
| 6,271,580 B1 | 8/2001 | Corisis |
| 6,274,927 B1 | 8/2001 | Glenn |
| 6,277,757 B1 | 8/2001 | Lin et al. |
| 6,285,064 B1 | 9/2001 | Foster |
| 6,291,894 B1 | 9/2001 | Farnworth et al. |
| 6,294,837 B1 | 9/2001 | Akram et al. |
| 6,326,689 B1 | 12/2001 | Thomas |
| 6,326,697 B1 | 12/2001 | Farnworth |
| 6,341,009 B1 | 1/2002 | O'Connor et al. |
| 6,344,976 B1 | 2/2002 | Schoenfeld et al. |
| 6,351,027 B1 | 2/2002 | Giboney et al. |
| 6,359,328 B1 | 3/2002 | Dubin |
| 6,372,548 B2 | 4/2002 | Bessho et al. |
| 6,391,770 B2 | 5/2002 | Kosaki et al. |
| 6,407,381 B1 | 6/2002 | Glenn et al. |
| 6,437,441 B1 | 8/2002 | Yamamoto et al. |
| 6,441,487 B2 | 8/2002 | Elenius et al. |
| 6,459,039 B1 | 10/2002 | Bezama et al. |
| 6,468,889 B1 | 10/2002 | Iacoponi et al. |
| 6,483,652 B2 | 11/2002 | Nakamura |
| 6,486,083 B1 | 11/2002 | Mizuno et al. |
| 6,486,549 B1 | 11/2002 | Chiang et al. |
| 6,503,780 B1 | 1/2003 | Glenn et al. |
| 6,541,762 B2 | 4/2003 | Kang et al. |
| 6,545,563 B1 | 4/2003 | Smith |
| 6,555,782 B2 | 4/2003 | Isaji et al. |
| 6,560,047 B2 | 5/2003 | Choi et al. |
| 6,566,745 B1 | 5/2003 | Beyne et al. |
| 6,569,711 B1 | 5/2003 | Susko et al. |
| 6,569,777 B1 | 5/2003 | Hsu et al. |
| 6,576,531 B2 | 6/2003 | Peng et al. |
| 6,580,174 B2 | 6/2003 | McCormick et al. |
| 6,593,644 B2 | 7/2003 | Chiu et al. |
| 6,603,183 B1 | 8/2003 | Hoffman |
| 6,614,033 B2 | 9/2003 | Suguro et al. |
| 6,617,623 B2 | 9/2003 | Rhodes |
| 6,620,731 B1 | 9/2003 | Farnworth et al. |
| 6,638,410 B2 | 10/2003 | Chen et al. |
| 6,653,236 B2 | 11/2003 | Wai et al. |
| 6,658,818 B2 | 12/2003 | Kurth et al. |
| 6,660,622 B2 | 12/2003 | Chen et al. |
| 6,660,630 B1 | 12/2003 | Chang et al. |
| 6,661,047 B2 | 12/2003 | Rhodes |
| 6,667,551 B2 | 12/2003 | Hanaoka et al. |
| 6,670,986 B1 | 12/2003 | Ben Shoshan et al. |
| 6,680,459 B2 | 1/2004 | Kanaya et al. |
| 6,686,588 B1 | 2/2004 | Webster et al. |
| 6,699,787 B2 | 3/2004 | Mashino et al. |
| 6,703,310 B2 | 3/2004 | Mashino et al. |
| 6,734,419 B1 | 5/2004 | Glenn et al. |
| 6,746,971 B1 | 6/2004 | Ngo et al. |
| 6,759,266 B1 | 7/2004 | Hoffman |
| 6,774,486 B2 | 8/2004 | Kinsman |

| | | | | | |
|---|---|---|---|---|---|
| 6,777,244 B2 | 8/2004 | Pepper et al. | 2002/0190371 A1 | 12/2002 | Mashino et al. |
| 6,778,046 B2 | 8/2004 | Stafford et al. | 2003/0014895 A1 | 1/2003 | Lizotte |
| 6,780,749 B2 | 8/2004 | Masumoto et al. | 2003/0062601 A1 | 4/2003 | Harnden et al. |
| 6,790,775 B2 | 9/2004 | Fartash | 2003/0119308 A1 | 6/2003 | Geefay et al. |
| 6,791,076 B2 | 9/2004 | Webster | 2003/0216023 A1 | 11/2003 | Wark et al. |
| 6,795,120 B2 | 9/2004 | Takagi et al. | 2004/0012698 A1 | 1/2004 | Suda et al. |
| 6,797,616 B2 | 9/2004 | Kinsman | 2004/0018712 A1 | 1/2004 | Plas et al. |
| 6,800,943 B2 | 10/2004 | Adachi | 2004/0023447 A1 | 2/2004 | Hirakata et al. |
| 6,809,421 B1 | 10/2004 | Hayasaka et al. | 2004/0023469 A1 | 2/2004 | Suda |
| 6,813,154 B2 | 11/2004 | Diaz et al. | 2004/0038442 A1 | 2/2004 | Kinsman |
| 6,818,464 B2 | 11/2004 | Heschel et al. | 2004/0041261 A1 | 3/2004 | Kinsman |
| 6,825,458 B1 | 11/2004 | Moess et al. | 2004/0043607 A1 | 3/2004 | Farnworth et al. |
| 6,828,175 B2 | 12/2004 | Wood et al. | 2004/0073607 A1 | 4/2004 | Su et al. |
| 6,828,223 B2 | 12/2004 | Chuang | 2004/0082094 A1 | 4/2004 | Yamamoto |
| 6,828,663 B2 | 12/2004 | Chen et al. | 2004/0087441 A1 | 5/2004 | Bock et al. |
| 6,828,674 B2 | 12/2004 | Karpman | 2004/0137661 A1 | 7/2004 | Murayama |
| 6,838,377 B2 | 1/2005 | Tonami et al. | 2004/0137701 A1 | 7/2004 | Takao |
| 6,844,978 B2 | 1/2005 | Harden et al. | 2004/0159958 A1 | 8/2004 | Funaki |
| 6,856,023 B2 | 2/2005 | Muta et al. | 2004/0178491 A1 | 9/2004 | Akram et al. |
| 6,864,172 B2 | 3/2005 | Noma et al. | 2004/0180539 A1 | 9/2004 | Yamamoto et al. |
| 6,873,054 B2 | 3/2005 | Miyazawa et al. | 2004/0192033 A1 | 9/2004 | Hara |
| 6,882,021 B2 | 4/2005 | Boon et al. | 2004/0198033 A1 | 10/2004 | Lee et al. |
| 6,885,107 B2 | 4/2005 | Kinsman | 2004/0198040 A1 | 10/2004 | Geefay et al. |
| 6,903,012 B2 | 6/2005 | Geefay et al. | 2004/0214373 A1 | 10/2004 | Jiang et al. |
| 6,903,442 B2 | 6/2005 | Wood et al. | 2004/0219763 A1 | 11/2004 | Kim et al. |
| 6,910,268 B2 | 6/2005 | Miller | 2004/0222082 A1 | 11/2004 | Gopalraja et al. |
| 6,916,725 B2 | 7/2005 | Yamaguchi et al. | 2004/0245649 A1 | 12/2004 | Imaoka |
| 6,934,065 B2 | 8/2005 | Kinsman | 2004/0255258 A1 | 12/2004 | Li |
| 6,936,536 B2 | 8/2005 | Sinha | 2004/0262753 A1 | 12/2004 | Kashiwazaki |
| 6,943,056 B2 | 9/2005 | Nemoto et al. | 2005/0026443 A1 | 2/2005 | Goo et al. |
| 6,946,325 B2 | 9/2005 | Yean et al. | 2005/0037608 A1 | 2/2005 | Andricacos et al. |
| 6,953,748 B2 | 10/2005 | Yamaguchi et al. | 2005/0046002 A1 | 3/2005 | Lee et al. |
| 6,970,775 B2 | 11/2005 | Lederle et al. | 2005/0052751 A1 | 3/2005 | Liu et al. |
| 6,982,487 B2 | 1/2006 | Kim et al. | 2005/0064707 A1 | 3/2005 | Sinha |
| 7,022,609 B2 | 4/2006 | Yamamoto et al. | 2005/0069782 A1 | 3/2005 | Elenius et al. |
| 7,023,090 B2 | 4/2006 | Huang et al. | 2005/0101116 A1 | 5/2005 | Tseng |
| 7,029,937 B2 | 4/2006 | Miyazawa et al. | 2005/0104228 A1 | 5/2005 | Rigg et al. |
| 7,033,927 B2 | 4/2006 | Cohen et al. | 2005/0106834 A1 | 5/2005 | Andry et al. |
| 7,041,598 B2 | 5/2006 | Sharma | 2005/0110095 A1 | 5/2005 | Shih et al. |
| 7,045,015 B2 | 5/2006 | Renn et al. | 2005/0110889 A1 | 5/2005 | Tuttle et al. |
| 7,084,073 B2 | 8/2006 | Lee et al. | 2005/0127478 A1 | 6/2005 | Hiatt et al. |
| 7,091,124 B2 | 8/2006 | Rigg et al. | 2005/0136646 A1 | 6/2005 | Larnerd et al. |
| 7,092,284 B2 | 8/2006 | Braun et al. | 2005/0139390 A1 | 6/2005 | Kim et al. |
| 7,094,677 B2 | 8/2006 | Yamamoto et al. | 2005/0151228 A1 | 7/2005 | Tanida et al. |
| 7,109,068 B2 | 9/2006 | Akram et al. | 2005/0164500 A1 | 7/2005 | Lindgren |
| 7,151,009 B2 | 12/2006 | Kim et al. | 2005/0184219 A1 | 8/2005 | Kirby |
| 7,164,565 B2 | 1/2007 | Takeda | 2005/0191861 A1 | 9/2005 | Verhaverbeke |
| 7,166,247 B2 | 1/2007 | Kramer | 2005/0194169 A1 | 9/2005 | Tonomura |
| 7,170,183 B1 | 1/2007 | Kim et al. | 2005/0231626 A1 | 10/2005 | Tuttle et al. |
| 7,183,176 B2 | 2/2007 | Sankarapillai et al. | 2005/0236708 A1 | 10/2005 | Farnworth et al. |
| 7,183,653 B2 | 2/2007 | Myers et al. | 2005/0247894 A1 | 11/2005 | Watkins et al. |
| 7,186,650 B1 | 3/2007 | Dakshina-Murthy | 2005/0253213 A1 | 11/2005 | Jiang et al. |
| 7,190,061 B2 | 3/2007 | Lee et al. | 2005/0254133 A1 | 11/2005 | Akram et al. |
| 7,199,050 B2 | 4/2007 | Hiatt | 2005/0258530 A1 | 11/2005 | Vindasius et al. |
| 7,217,596 B2 | 5/2007 | Cobbley et al. | 2005/0270651 A1 | 12/2005 | Boettiger et al. |
| 7,217,888 B2 | 5/2007 | Sunohara et al. | 2005/0272221 A1 | 12/2005 | Yen et al. |
| 7,232,754 B2 | 6/2007 | Kirby et al. | 2005/0275048 A1 | 12/2005 | Farnworth et al. |
| 7,256,073 B2 | 8/2007 | Noma et al. | 2005/0275049 A1 | 12/2005 | Kirby et al. |
| 7,262,134 B2 | 8/2007 | Kirby et al. | 2005/0275051 A1 | 12/2005 | Farnworth et al. |
| 7,265,052 B2 | 9/2007 | Sinha | 2005/0275750 A1 | 12/2005 | Akram et al. |
| 7,271,482 B2 | 9/2007 | Kirby | 2005/0277293 A1 | 12/2005 | Kim et al. |
| 7,300,857 B2 | 11/2007 | Akram et al. | 2005/0282374 A1 | 12/2005 | Hwang et al. |
| 2002/0005583 A1 | 1/2002 | Harada et al. | 2005/0285154 A1 | 12/2005 | Akram et al. |
| 2002/0006687 A1 | 1/2002 | Lam | 2006/0011809 A1 | 1/2006 | Farnworth et al. |
| 2002/0020898 A1 | 2/2002 | Vu et al. | 2006/0014313 A1 | 1/2006 | Hall et al. |
| 2002/0057468 A1 | 5/2002 | Segawa et al. | 2006/0023107 A1 | 2/2006 | Bolken et al. |
| 2002/0059722 A1 | 5/2002 | Murakami | 2006/0024856 A1 | 2/2006 | Derderian et al. |
| 2002/0089025 A1 | 7/2002 | Chou | 2006/0035402 A1 | 2/2006 | Street et al. |
| 2002/0094607 A1 | 7/2002 | Gebauer et al. | 2006/0035415 A1 | 2/2006 | Farnworth et al. |
| 2002/0096729 A1 | 7/2002 | Tu et al. | 2006/0038183 A1 | 2/2006 | Oliver et al. |
| 2002/0113296 A1 | 8/2002 | Cho et al. | 2006/0038272 A1 | 2/2006 | Edwards |
| 2002/0130390 A1 | 9/2002 | Ker et al. | 2006/0040421 A1 | 2/2006 | Farnworth |
| 2002/0145676 A1 | 10/2002 | Kuno et la. | 2006/0040428 A1 | 2/2006 | Johnson |

| | | |
|---|---|---|
| 2006/0042952 A1 | 3/2006 | Oliver et al. |
| 2006/0043262 A1 | 3/2006 | Akram |
| 2006/0043509 A1 | 3/2006 | Watkins et al. |
| 2006/0043512 A1 | 3/2006 | Oliver et al. |
| 2006/0043569 A1 | 3/2006 | Benson et al. |
| 2006/0043599 A1 | 3/2006 | Akram et al. |
| 2006/0044433 A1 | 3/2006 | Akram |
| 2006/0046332 A1 | 3/2006 | Derderian et al. |
| 2006/0046468 A1 | 3/2006 | Akram et al. |
| 2006/0046471 A1 | 3/2006 | Kirby et al. |
| 2006/0046537 A1 | 3/2006 | Chong et al. |
| 2006/0057776 A1 | 3/2006 | Tao |
| 2006/0057836 A1 | 3/2006 | Nagarajan et al. |
| 2006/0151880 A1 | 7/2006 | Tang et al. |
| 2006/0154153 A1 | 7/2006 | Chiang et al. |
| 2006/0160367 A1 | 7/2006 | Wai et al. |
| 2006/0175532 A1 | 8/2006 | Boemler |
| 2006/0177959 A1 | 8/2006 | Boettiger et al. |
| 2006/0177999 A1 | 8/2006 | Hembree et al. |
| 2006/0180941 A1 | 8/2006 | Kirby et al. |
| 2006/0186097 A1 | 8/2006 | Watkins et al. |
| 2006/0186492 A1 | 8/2006 | Boettiger et al. |
| 2006/0191882 A1 | 8/2006 | Watkins et al. |
| 2006/0199363 A1 | 9/2006 | Kirby et al. |
| 2006/0204651 A1 | 9/2006 | Wai et al. |
| 2006/0208360 A1 | 9/2006 | Yiu et al. |
| 2006/0216862 A1 | 9/2006 | Rigg et al. |
| 2006/0240687 A1 | 10/2006 | Chong et al. |
| 2006/0252262 A1 | 11/2006 | Kazemi |
| 2006/0255443 A1 | 11/2006 | Hwang et al. |
| 2006/0264041 A1 | 11/2006 | Rigg et al. |
| 2006/0270108 A1 | 11/2006 | Farnworth et al. |
| 2006/0278980 A1 | 12/2006 | Trezza et al. |
| 2006/0278988 A1 | 12/2006 | Trezza et al. |
| 2006/0281224 A1 | 12/2006 | Edelstein et al. |
| 2006/0281243 A1 | 12/2006 | Trezza |
| 2006/0289968 A1 | 12/2006 | Sulfridge |
| 2006/0290001 A1 | 12/2006 | Sulfridge |
| 2006/0292877 A1 | 12/2006 | Lake |
| 2007/0004079 A1 | 1/2007 | Geefay et al. |
| 2007/0012655 A1 | 1/2007 | Kwon et al. |
| 2007/0020805 A1 | 1/2007 | Kim et al. |
| 2007/0020935 A1 | 1/2007 | Taylor et al. |
| 2007/0023121 A1 | 2/2007 | Jones et al. |
| 2007/0032061 A1 | 2/2007 | Farnworth et al. |
| 2007/0035033 A1 | 2/2007 | Ozguz et al. |
| 2007/0037379 A1 | 2/2007 | Enquist et al. |
| 2007/0042598 A1 | 2/2007 | Park |
| 2007/0045120 A1 | 3/2007 | Tiwari et al. |
| 2007/0045388 A1 | 3/2007 | Farnworth et al. |
| 2007/0045515 A1 | 3/2007 | Farnworth et al. |
| 2007/0045632 A1 | 3/2007 | Oliver et al. |
| 2007/0045779 A1 | 3/2007 | Hiatt |
| 2007/0045806 A1 | 3/2007 | Hsuan |
| 2007/0045812 A1 | 3/2007 | Heng |
| 2007/0045826 A1 | 3/2007 | Lee et al. |
| 2007/0045834 A1 | 3/2007 | Chong et al. |
| 2007/0045858 A1 | 3/2007 | Kirby et al. |
| 2007/0048896 A1 | 3/2007 | Andry et al. |
| 2007/0048994 A1 | 3/2007 | Tuttle |
| 2007/0049016 A1 | 3/2007 | Hiatt et al. |
| 2007/0049019 A1 | 3/2007 | Wai et al. |
| 2007/0057028 A1 | 3/2007 | Lake et al. |
| 2007/0077753 A1 | 4/2007 | Iwatake et al. |
| 2007/0082427 A1 | 4/2007 | Shirahama et al. |
| 2007/0096263 A1 | 5/2007 | Furukawa et al. |
| 2007/0099395 A1 | 5/2007 | Sridhar et al. |
| 2007/0138562 A1 | 6/2007 | Trezza |
| 2007/0152342 A1 | 7/2007 | Tsao et al. |
| 2007/0155997 A1 | 7/2007 | Li et al. |
| 2007/0158839 A1 | 7/2007 | Trezza |
| 2007/0158853 A1 | 7/2007 | Sinha |
| 2007/0161235 A1 | 7/2007 | Trezza |
| 2007/0166991 A1 | 7/2007 | Sinha |
| 2007/0166997 A1 | 7/2007 | Knorr |
| 2007/0167004 A1 | 7/2007 | Trezza |
| 2007/0170574 A1 | 7/2007 | Lauxtermann et al. |
| 2007/0178694 A1 | 8/2007 | Hiatt |
| 2007/0182020 A1 | 8/2007 | Trezza et al. |
| 2007/0190803 A1 | 8/2007 | Singh et al. |
| 2007/0197013 A1 | 8/2007 | Trezza |
| 2007/0202617 A1 | 8/2007 | Hembree |
| 2007/0222054 A1 | 9/2007 | Hembree |
| 2007/0228576 A1 | 10/2007 | Trezza |
| 2007/0228926 A1 | 10/2007 | Teo et al. |
| 2007/0262424 A1 | 11/2007 | Hiatt |
| 2007/0281473 A1 | 12/2007 | Clark et al. |
| 2008/0050911 A1 | 2/2008 | Borthakur |
| 2008/0054444 A1 | 3/2008 | Tuttle |
| 2008/0057620 A1 | 3/2008 | Pratt |

FOREIGN PATENT DOCUMENTS

| | | |
|---|---|---|
| EP | 0 886 323 | 12/1998 |
| EP | 1 157 967 A1 | 11/2001 |
| FR | 2 835 654 A1 | 8/2003 |
| JP | 59-101882 A | 6/1984 |
| JP | 59-191388 | 10/1984 |
| JP | 63052432 | 3/1988 |
| JP | 07-263607 A | 10/1995 |
| JP | 2001-077496 A | 3/2001 |
| JP | 2001298147 | 10/2001 |
| JP | 2005093980 | 4/2005 |
| JP | 2005310817 | 11/2005 |
| KR | 20020022122 | 3/2002 |
| KR | 20020061812 | 7/2002 |
| WO | WO-90/05424 A1 | 5/1990 |
| WO | WO-02/075815 A1 | 9/2002 |
| WO | WO-02/095796 A2 | 11/2002 |
| WO | WO-2004/054001 A2 | 6/2004 |
| WO | 2005022965 | 3/2005 |
| WO | 2005036940 | 4/2005 |
| WO | 2006053036 | 5/2006 |
| WO | 2006124597 | 11/2006 |
| WO | 2007025812 | 3/2007 |
| WO | 2007043718 | 4/2007 |

OTHER PUBLICATIONS

Aachboun, S. and P. Ranson, "Deep anisotropic etching of silicon," J. Vac. Sci. Technol. A 17(4), Jul./Aug. 1999, pp. 2270-2273.

Austin, M.D. and S.Y. Chou, "Fabrication of 70 nm channel length polymer organic thin-film transistors using nanoimprint lithography," Applied Physics Letters, vol. 81, No. 23, pp. 4431-4433, Dec. 2, 2002, American Institute of Physics.

Blackburn, J.M. et al., "Deposition of Conformal Copper and Nickel Films from Supercritical Carbon Dioxide," Science, vol. 294, pp. 141-145, Oct. 5, 2001.

Brubaker, C. et al., "Ultra-thick Lithography for Advanced Packaging and MEMS," SPIE's 27th Annual International Symposium on Microlithography 2002, Mar. 3-8, 2002, Santa Clara, CA.

Cheng, Yu-T. et al., "Vacuum Packaging Technology Using Localized Aluminum/Silicon-to-Glass Bonding," Journal of Microelectromechanical Systems, vol. 11, No. 5, pp. 556-565, Oct. 2002.

DuPont Electronic Materials, Data Sheet, Pyralux PC 2000 Flexible Composites, 4 pages, Oct. 1998, <http://www.dupont.com/fcm>.

Edmund Industrial Optics, Mounted IR Filters, 1 page, retrieved from the Internet on Jun. 30, 2003, <http://www.edmundoptics.com>.

Hamdorf, M. et al., "Surface-rheological measurements on glass forming polymers based on the surface tension driven decay of imprinted corrugation gratings," Journal of Chemical Physics, vol. 112, No. 9, pp. 4262-4270, Mar. 1, 2000, American Institute of Physics.

Hirafune, S. et al., "Packaging Technology for Imager Using Through-hole Interconnection in Si Substrate," Proceeding of HDP'04, IEEE, pp. 303-306, Jul. 2004.

IBM, Zurich Research Laboratory, EPON SU-8 photoresist, 1 page, retrieved from the Internet on Jan. 21, 2003, <http://www.zurich.ibm.com/st/mems/su8.html>.

Intrinsic Viscosity and Its Relation to Intrinsic Conductivity, 9 pages, retrieved from the Internet on Oct. 30, 2003, <http://www.ciks.cbt.nist.gov/~garbocz/paper58/node3.html>.

King, B. et al., Optomec, Inc., M3D™ Technology, Maskless Mesoscale™ Materials Deposition, 5 pages, <http://www.optomec.com/downloads/M3D%20White%Paper%20080502.pdf>, retrieved from the Internet on Jun. 17, 2005.

Kingpak Technology, Inc. "CMOS Image Sensor Packaging," 1 page, retrieved from the Internet on Aug. 26, 2003, <http://www.kingpak.com/CMOSImager.html>.

Kramer, S.J. et al., "Annual Report—Applications of Supercritical Fluid Technology to Semiconductor Device Processing," pp. 1-29, Nov. 2001.

Kyocera Corporation, Memory Package, 1 page, retrieved from the Internet on Dec. 3, 2004, <http://global.kyocera.com/prdct/semicon/ic_pkg/memory_p.html>.

Lin, Tim (Zhigang) and Rick Yoon, "One Package Technique of Exposed MEMS Sensors," pp. 105-108, 2002 International Symposium on Microelectronics, Sep. 2002.

Ma, X. et al., "Low Temperature Bonding for Wafer Scale Packaging and Assembly of Micromachined Sensors," Final Report 1998-1999 for Micro Project 98-144, 3 pages, Department of Electrical & Computer Engineering, University of California, Davis.

Micro Chem, Nano SU-8, Negative Tone Photoresist Formulations 50-100, 4 pages, Feb. 2002, <http://www.microchem.com/products/pdf/SU8_50-100.pdf>.

Optomec, Inc., M3D™ Technology, Maskless Mesoscale Materials Deposition (M3D), 1 page, <http://www.optomec.com/html/m3d.htm>, retrieved from the Internet on Aug. 15, 2003.

Optomec, Inc., M3D™, Maskless Mesoscale™ Materials Deposition, 2 pages, <http://www.optomec.com/downloads/M3DSheet.pdf>, retrieved from the Internet on Jun. 17, 2005.

Photo Vision Systems, Inc., "Advances in Digital Image Sensors," 22 pages, First Annual New York State Conference on Microelectronic Design, Jan. 12, 2002.

Shen, X.-J. et al., "Microplastic embossing process: experimental and theoretical characterizations," Sensors and Actuators, A 97-98 (2002) pp. 428-433, Elsevier Science B.V.

Tapes II International Tape and Fabrication Company, Electronics and Electrical Tapes, 2 pages, 2003, <http://www.tapes2.com/electronics.htm>.

TransChip, 1 page, retrieved from the Internet on Aug. 26, 2003, <http://www.missionventures.com/portfolio/companies/transchip.html>.

TransChip, Inc., CMOS vs CCD, 3 pages, retrieved from the Internet on Dec. 14, 2005, <http://www.transchip.com/content.aspx?id=127>.

TransChip, Inc., Technology, 3 pages, retrieved from the Internet on Dec. 14, 2005, <http://www.transchip.com/content.aspx?id=10>.

UCI Integrated Nanosystems Research Facility, "Cleaning procedures for glass substrates," 3 pages, Fall 1999.

UCI Integrated Nanosystems Research Facility, "Glass Etch Wet Process," 3 pages, Summer 2000.

Walker, M.J., "Comparison of Bosch and cryogenic processes for patterning high aspect ratio features in silicon," 11 pages, Proc. SPIE vol. 4407, p. 89-99, MEMS Design, Fabrication, Characterization, and Packaging, Uwe F. Behringer; Deepak G. Uttamchandani; Eds., Apr. 2001.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

Ye, X.R. et al., "Immersion Deposition of Metal Films on Silicon and Germanium Substrates in Supercritical Carbon Dioxide," Chem. Mater. 2003, 15, 83-91.

Yoshida, J. "TransChip rolls out a single-chip CMOS imager," 3 pages, EE Times, Jul 18, 2003.

Arunasalam, P. et al., "Thermo-Mechanical Analysis of Thru-Silicon-Via Based High Density Compliant Interconnect," Electronic Components and Technology Conference, 2007, ECTC '07, Proceedings, 57th, May 29, 2007 - Jun. 1, 2007, pp. 1179-1185.

Bernstein, K. et al., "Interconnects in the Third Dimension: Design Challenges for 3D ICs," Design Automation Conference, 2007, DAC '07, 44th ACM/IEEE, Jun. 4-8, 2007, pp. 562-567.

Cheung, T.S.D. et al., "On-Chip Interconnect for mm-Wave Applications Using an All-Copper Technology and Wavelength Reduction," 2003 IEEE International Solid-State Circuits Conference. Feb. 2003.

Chou, Bill et al., "Ultra Via Substrate for Advanced BGA Applications," Pan Pacific Symposium, Jan. 25, 2000, <http://www.smta.org/files/PanPac00-ChouBill.pdf>.

Lee, Rex A. et al., "Laser Created Silicon Vias for Stacking Dies in MCMs," IEEE/CHMT IEMT Symposium, 1991, pp. 262-265. Sep. 1991.

Lee, T.K. et al., "A Novel Joint-in-Via Flip-Chip Chip-Scale Package," IEEE Transactions on Advanced Packaging, vol. 29, No. 1, pp. 186-194, Feb. 2006.

Rasmussen, F.E., et al., "Fabrication of High Aspect Ratio Through-Wafer Vias in CMOS Wafers for 3-D Packaging Applications," The 12th International Conference on Solid State Sensors, Actuators and Microsystems, Boston, Jun. 8-12, 2003.

Savastiouk, S. et al., "Thru-silicon interconnect technology," 26th IEEE/CPMT International Electronics Manufacturing Technology Symposium, 2000, abstract. Oct. 2000.

Schaper, L. et al., "Integrated System Development for 3-D VLSI," Electronic Components and Technology Conference, 2007, ECTC '07, Proceedings, 57th, May 29, 2007 - Jun. 1, 2007, pp. 853-857.

Takahashi, K. et al. "Through Silicon Via and 3-D Wafer/Chip Stacking Technology," 2006 Symposium on VLSI Circuits Digest of Technical Papers.

Takizawa, T. et al., "Conductive Interconnections Through Thick Silicon Substrates for 3D Packaging," The Fifteenth International Conference on Micro Electro Mechanical Systems, Las Vegas, Jan. 20-24, 2002.

Tezcan, D.S. et al., "Sloped Through Wafer Vias for 3D Wafer Level Packaging," Electronic Components and Technology Conference, 2007, ECTC '07, Proceedings, 57th, May 29, 2007 - Jun. 1, 2007, pp. 643-647.

Trigas, C., "System-In-Package or System-On-Chip?," EE Times, Sep. 19, 2003, <http://www.eetimes.com/story/OEG20030919S0049>.

XSiL, xise200 for vies and micro-machining, <http://www.xsil.com/products/index/html>, retrieved from the Internet on Aug. 16, 2003.

Yamamoto, S. et al., "Si Through-Hole Interconnections Filled with Au-Sn Solder by Molten Metal Suction Method," pp. 642-645, IEEE, MEMS-03 Kyoto, The Sixteenth Annual International Conference on Micro Electro Mechanical Systems, Jan. 2003, ISBN 0-7803-7744-3.

METHODS FOR FORMING INTERCONNECTS IN MICROELECTRONIC WORKPIECES AND MICROELECTRONIC WORKPIECES FORMED USING SUCH METHODS

CROSS-REFERENCE TO RELATED APPLICATION

This application is a divisional of U.S. application Ser. No. 11/027,443, filed Dec. 30, 2004, now U.S. Pat. No. 7,271,482, issued Sep. 18, 2007, which is incorporated herein by reference in its entirety.

APPLICATIONS INCORPORATED BY REFERENCE

The present application is in a related area of subject matter as the following U.S. applications, which are incorporated herein by reference: U.S. application Ser. No. 10/879,398, filed Jun. 29, 2004, now U.S. Pat. No. 7,294,897, issued Nov. 13, 2007; U.S. application Ser. No. 10/864,974 entitled "Packaged Microelectronic Imagers and Methods of Packaging Microelectronic Imagers" filed Jun. 10, 2004; and U.S. application Ser. No. 11/056,211 entitled "Microelectronic Workpieces and Methods for Forming Interconnects in Microelectronic Workpieces" filed Feb. 10, 2005.

TECHNICAL FIELD

The present invention relates to forming interconnects in microelectronic workpieces and microelectronic workpieces formed using such methods.

BACKGROUND

Conventional packaged microelectronic devices can include a singulated microelectronic die, an interposer substrate or lead frame attached to the die, and a molded casing around the die. The die generally includes an integrated circuit and a plurality of bond-pads coupled to the integrated circuit. The bond-pads are typically coupled to terminals on the interposer substrate or lead frame, and supply voltage, signals, etc., are transmitted to and from the integrated circuit via the bond-pads. In addition to the terminals, the interposer substrate can also include ball-pads coupled to the terminals by conductive traces supported in a dielectric material. Solder balls can be attached to the ball-pads in one-to-one correspondence to define a "ball-grid array." Packaged microelectronic devices With ball-grid arrays are generally higher grade packages having lower profiles and higher pin counts than conventional packages using lead frames.

Packaged microelectronic devices such as those described above are used in cellphones, pagers, personal digital assistants, computers, and many other electronic products. To meet the demand for smaller electronic products, there is a continuing drive to increase the performance of packaged microelectronic devices, while at the same time reducing the height and the surface area or "footprint" of such devices on printed circuit boards. Reducing the size of high-performance devices, however, is difficult because the sophisticated integrated circuitry of such devices requires more bond-pads, which results in larger ball-grid arrays and thus larger footprints. One technique for increasing the component density of microelectronic devices within a given footprint is to stack one device on top of another.

FIG. 1 schematically illustrates a first microelectronic device 10 attached to a second microelectronic device 20 in a wire-bonded, stacked-die arrangement. The first microelectronic device 10 includes a die 12 having an integrated circuit 14 electrically coupled to a series of bond-pads 16. A redistribution layer 18 electrically couples a plurality of first solder balls 11 to corresponding bond-pads 16. The second microelectronic device 20 similarly includes a die 22 having an integrated circuit 24 electrically coupled to a series of bond-pads 26. A redistribution layer 28 electrically couples a plurality of second solder balls 21 to corresponding bond-pads 26. Wire-bonds 13 extending from the first solder balls 11 to the second solder balls 21 electrically couple the first microelectronic device 10 to the second microelectronic device 20.

Forming the wire-bonds 13 in the stacked device shown in FIG. 1 can be complex and/or expensive because it requires placing individual wires between corresponding pairs of contacts (e.g., the first solder balls 11 and the second solder balls 21). Further, this type of installation may not be feasible for the high-density, fine-pitch arrays of some high-performance devices because the contacts are not spaced far enough apart to be connected to individual wire-bonds. As such, processes for packaging the dies have become a significant factor in manufacturing microelectronic devices.

DETAILED DESCRIPTION

A. Overview

Figure 1:
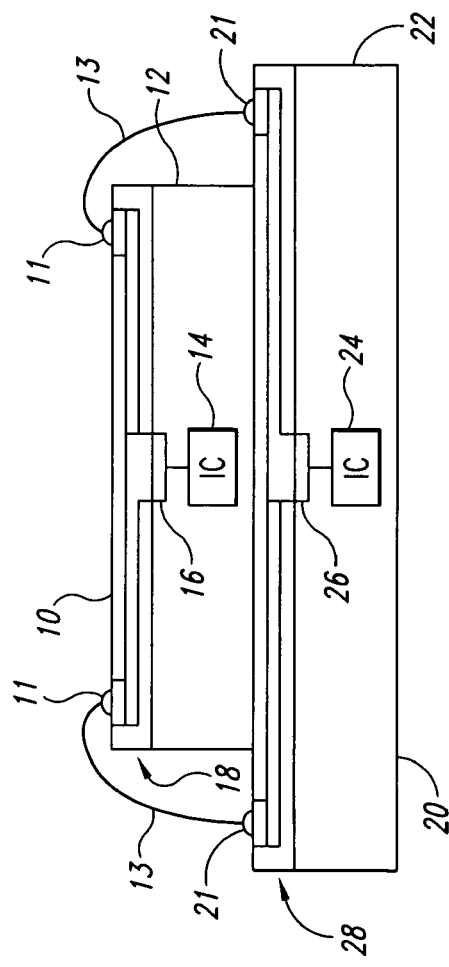
FIG. 1 is a side cross-sectional view of a first microelectronic device attached to a second microelectronic device in a stacked-die arrangement in accordance with the prior art.

The following disclosure describes several embodiments of methods for forming electrically conductive through-wafer interconnects in microelectronic workpieces and microelectronic workpieces having such interconnects. Such interconnects electrically couple terminals or other conductive elements proximate to one side of the workpiece to conductive elements proximate to the other side of the workpiece. The following describes several embodiments of methods for forming interconnects in (1) through-holes extending through the workpiece, and (2) blind holes or vias extending to an intermediate depth in the workpiece.

One aspect of the invention is directed toward a method for manufacturing a microelectronic workpiece having a plurality of microelectronic dies. The individual dies include an integrated circuit and a terminal electrically coupled to the integrated circuit. In one embodiment, the method includes forming an opening in the workpiece in alignment with the terminal. The opening can be a through-hole extending through the workpiece or a blind hole that extends only partially through the substrate. The opening can be etched and/or cut using a laser. The method continues by applying an isolation material to at least a portion of the opening. The isolation material electrically insulates the other components in the substrate from the solder material filling the opening. The method further includes depositing a solder material into at least a portion of the opening and in electrical contact with the terminal to construct an electrically conductive interconnect in the workpiece. In embodiments that include forming a blind hole, the workpiece can be thinned either before or after forming the hole.

One embodiment of a method for constructing the interconnect includes depositing an isolation material onto the workpiece and into the opening using a pulsed layer deposition process. The method continues by depositing a barrier layer onto the workpiece and into the opening. The barrier layer protects the other components in the workpiece from the other materials in the opening (e.g., copper). The method then includes depositing a seed layer onto the workpiece and into the opening. A layer of resist is then deposited over the workpiece and an aperture is formed over the opening. A conductive layer is then deposited into the opening and over at least a portion of the seed layer to form a conductive liner in the opening. The conductive layer can act as a wetting agent for filling the opening with solder material to form the interconnect. The opening is then filled with the solder material. The layer of resist is then stripped from the workpiece and the exposed portions of the seed layer are removed using a suitable etching process.

In another embodiment, constructing the interconnect includes depositing an isolation material including a silane-based oxide material onto the workpiece and into the opening. The method then includes depositing a barrier layer onto the workpiece and into the opening. The method further includes depositing a wetting layer over at least a portion of the barrier layer. The opening is then filled with the solder material.

In still another embodiment, constructing the interconnect can include depositing a dielectric liner onto the workpiece and into the opening. The dielectric liner can include a furnace oxide or another suitable dielectric material. The method further includes depositing a conductive layer over at least a portion of the dielectric liner and depositing a wetting layer over at least a portion of the conductive layer. The opening is then filled with the solder material.

Another aspect of the invention is directed toward a microelectronic assembly including a microelectronic workpiece having a substrate with a front side and a backside. The assembly can also include a plurality of microelectronic dies on and/or in the substrate. The individual dies include an integrated circuit and a terminal electrically coupled to the integrated circuit. The assembly can also include an opening extending at least partially through the substrate and in alignment with the terminal. An isolation material can be disposed in the opening an in contact with the substrate. In several embodiments, the isolation material includes a low temperature oxide applied using a pulsed layer deposition process. In other embodiments, the isolation material can include a silane-based oxide material or anther suitable dielectric material. The assembly further includes an electrically conductive interconnect in at least a portion of the opening and in electrical contact with the terminal. The interconnect includes a solder material, such as a SnAgCu solder, a SnPb solder, a AuSn solder, a solder having another composition, and/or other suitable materials or alloys of materials having the desired conductivity. Solder balls or other external electrical contacts are subsequently attached to the interconnects at the backside of the workpiece.

Specific details of several embodiments of the invention are described below with reference to interconnects extending from a terminal proximate to the front side of a workpiece, but the methods and workpieces described below can be used for other types of interconnects within microelectronic workpieces. Several details describing structures or processes that are well known and often associated with other types of microelectronic devices are not set forth in the following description for purposes of brevity. Moreover, although the following disclosure sets forth several embodiments of the invention, several other embodiments of the invention can have different configurations or components than those described in this section. As such, it should be understood that the invention may have other embodiments with additional elements or without several of the elements described below with reference to FIGS. 2-15.

B. Microelectronic Workpieces Having Interconnects

Figure 2:
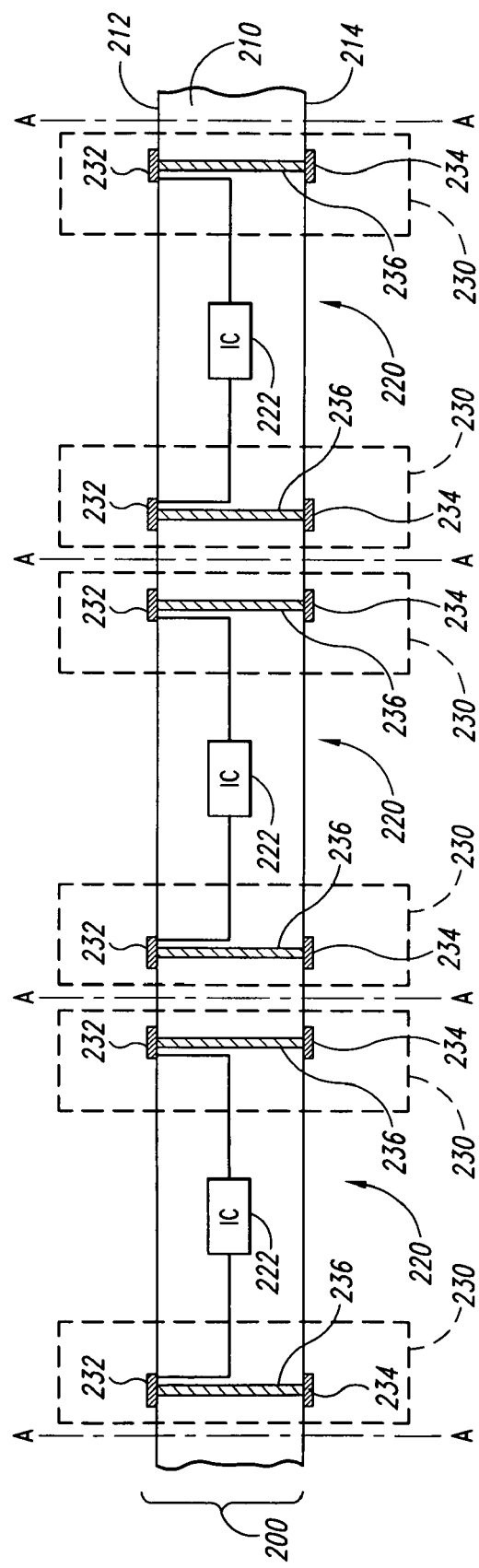
FIG. 2 is a side cross-sectional view of a microelectronic workpiece configured in accordance with several embodiments of the invention.

FIG. 2 is a side cross-sectional view of a microelectronic workpiece 200 configured in accordance with several embodiments of the invention. The microelectronic workpiece 200 illustrated in FIG. 2 includes a substrate 210 having a front side 212, a backside 214, and a plurality of microelectronic dies 220 formed on and/or in the substrate 210. The individual dies 220 can include an integrated circuit 222 and external contacts 230 electrically coupled to the integrated circuit 222.

The external contacts 230 shown in FIG. 2 provide a small array of ball-pads within the footprint of each die 220. Each external contact 230, for example, can include a terminal 232 (e.g., a bond-pad), an external contact pad 234 (e.g., a ball-pad), and an interconnect 236 coupling the terminal 232 to the contact pad 234. In the embodiment shown in FIG. 2, the terminals 232 are on the front side 212 of the substrate 210, the contact pads 234 are on the backside 214 of the substrate 210, and the interconnects 236 are through-wafer interconnects that extend completely through the substrate 210 to couple the terminals 232 to the contact pads 234. In other embodiments, however, the dies 220 may not include the terminals 232 on the front side 212 of the substrate 210 such that the integrated circuit 222 is coupled directly to the contact pads 234 on the backside 214 of the substrate 210 by interconnects that extend only through a portion of the substrate 210. After forming the interconnects 236, the microelectronic workpiece 200 can be cut along lines A-A to singulate the microelectronic dies 220.

The interconnects 236 enable the contact pads 234 to be on the backside 214 of the substrate 210, which provides several advantages. More specifically, the external contact pads 234 can be located on the backside 214 of the substrate 210 because the interconnects 236 shown in FIG. 2 are through-wafer interconnects that extend to the backside 214 of the substrate 210. The backside arrays of contact pads 234 allow the dies 220 to be stacked on other dies or attached directly to an interposer substrate without peripheral wirebonds. The dies 220 with the interconnects 236 are more robust than dies that require wire-bonds, and the individual dies 220 also have a significantly smaller footprint and profile than the conventional stacked devices shown in FIG. 1. Accordingly, the dies 220 can be used in smaller electronic devices. These advantages and others are described in greater detail below.

C. Methods for Forming Interconnects in Microelectronic Workpieces

Figure 3:
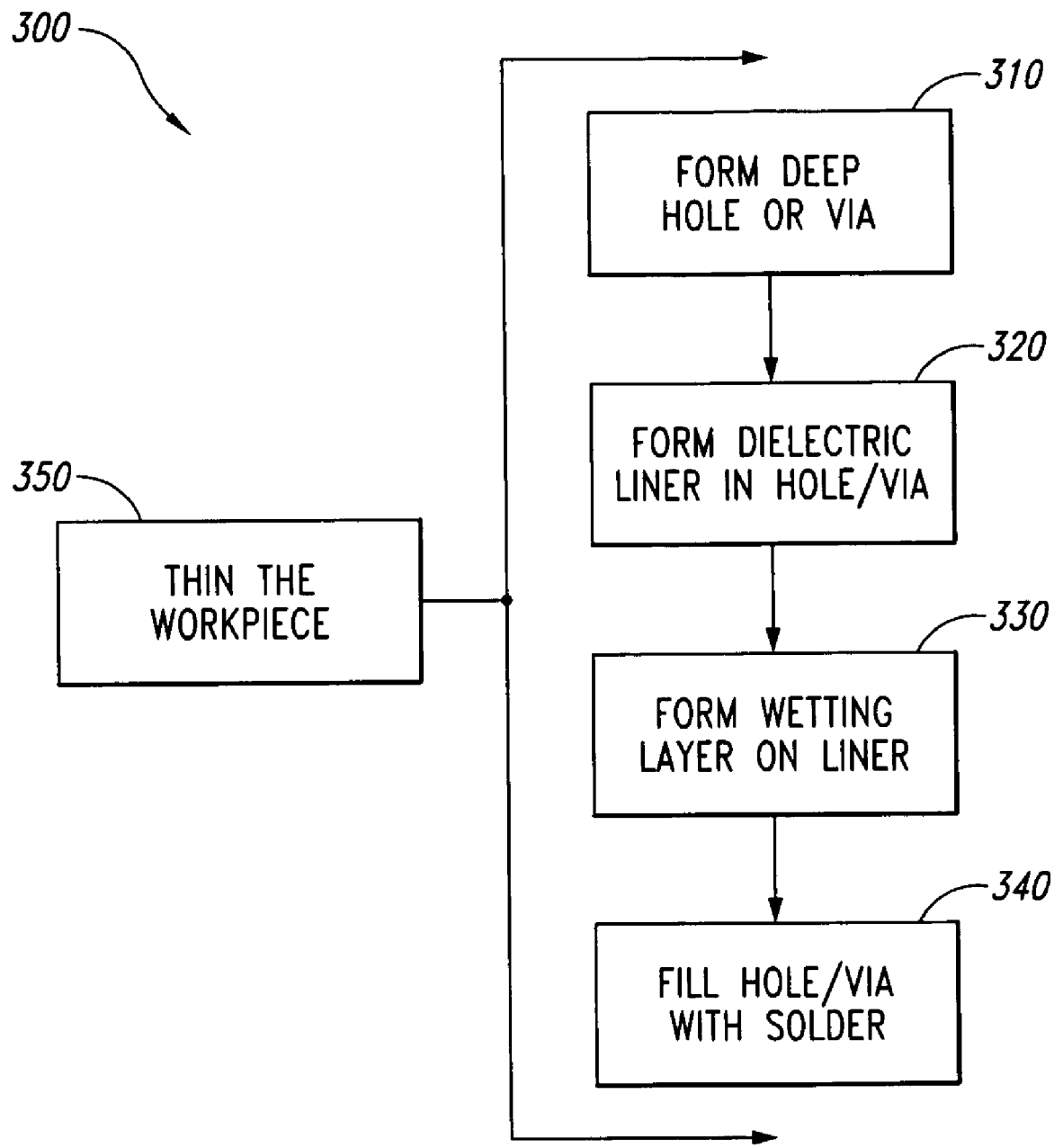
FIG. 3 is a flow chart illustrating stages in a method for forming electrically conductive interconnects in a microelectronic workpiece in accordance with several embodiments of the invention.

FIG. 3 is a flow chart of a method 300 for forming interconnects in a microelectronic workpiece in accordance with several embodiments of the invention. The method 300 includes forming a hole or deep via through the workpiece at stage 310. The hole or via can be created before, during, or after all the other microelectronic components of the workpiece are fabricated. At stage 320, the method 300 includes forming a dielectric liner in the hole or via. The dielectric liner electrically insulates the components of the workpiece from conductive material that is subsequently deposited into the hole or via to form an interconnect. The dielectric liner can include a variety of materials and/or layers.

At stage 330, a wetting layer is formed on the dielectric liner. The wetting layer facilitates depositing subsequent materials into the hole or via. The wetting layer can also include a variety of materials and/or layers. The hole or via is filled with solder at stage 340 to form an electrically conductive interconnect through at least a portion of the workpiece. The solder can be deposited into the hole or via in a number of ways. In several embodiments, the workpiece may be thinned at an optional stage 350 either before stage 310 or after stage 340. If the workpiece is thinned after stage 340, for example, the thinning process will generally expose a portion of the interconnect at a backside of the workpiece.

In one embodiment of the method 300, for example, the dielectric liner of stage 320 is formed using a pulsed layer deposition process. A barrier layer of tungsten is then applied over at least a portion of the dielectric liner. At stage 330, a layer of nickel is deposited onto the tungsten using an electroless plating process. At stage 340, the hole or via is filled with a SnAgCu solder using a vacuum reflow process.

In another embodiment of the method 300, a dielectric liner is formed using a silane-based oxide material at stage 320. A barrier layer of tungsten is then deposited over at least a portion of the dielectric liner. At stage 330, a layer of nickel is applied over the tungsten using an electroless plating process. The hole or via is filled at stage 340 with a SnPb solder.

In still another embodiment of the method 300, a dielectric liner is formed using a furnace oxide at stage 320. At stage 330, a layer of $TiCl_4TiN$ is formed on at least a portion of the furnace oxide and a layer of nickel is deposited onto the layer of $TiCl_4TiN$ using an electroplating process. At stage 340, the hole or via is filled with a SnPb solder applied using a solder wave process.

Various embodiments of the individual steps of the method 300 for forming interconnects set forth above with respect to FIG. 3 are described in detail below with reference to FIGS. 4-14; accordingly, like reference numbers refer to like components in FIGS. 4-14. More specifically, various embodiments of methods for forming interconnects in through-holes are described in more detail below under heading D entitled "Methods for Forming Interconnects in Through-Holes," embodiments of methods for forming interconnects in blind holes are described in greater detail under heading E entitled "Methods for Forming Interconnects in Blind Holes," and an embodiment of a microelectronic assembly is described in detail below under heading F entitled, "Embodiments of Microelectronic Devices." Although the following description illustrates forming just one interconnect, it will be appreciated that a plurality of interconnects are constructed simultaneously through a plurality of dies on a wafer. Additionally, several embodiments of specific microelectronic assemblies are described throughout these sections.

D. Methods for Forming Interconnects in Through-Holes

FIGS. 4-7B illustrate several embodiments of methods for forming the interconnects 236 shown in FIG. 2. More specifically, FIGS. 4-7B illustrate methods for forming interconnects by filling through-holes extending completely through the workpiece 200 with a solder material. Each of the embodiments described below can be used for implementing each of the examples set forth above with respect to FIG. 3.

Figure 4:
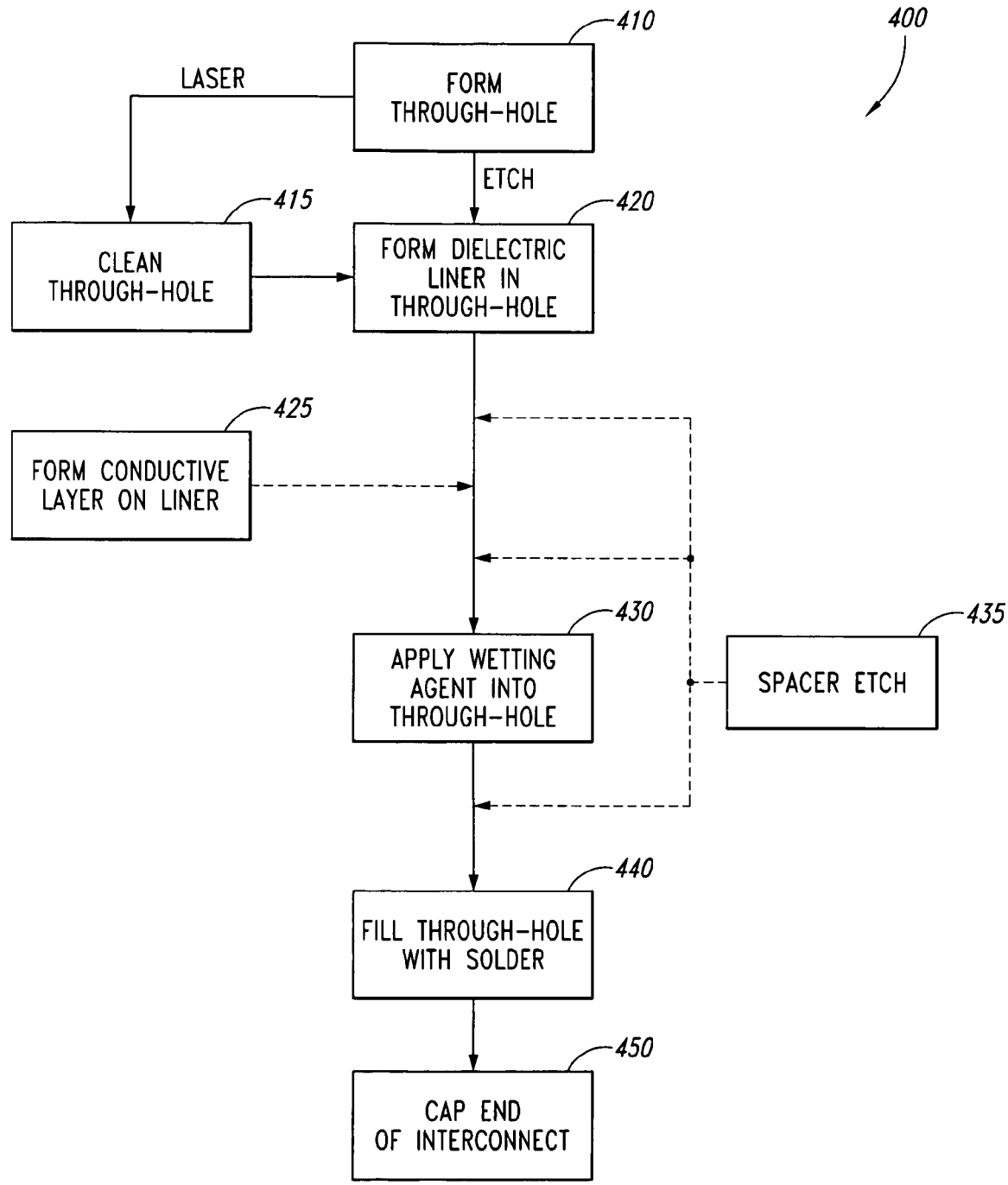
FIG. 4 is flow chart illustrating stages in a method for forming an electrically conductive interconnect in a through-hole in the microelectronic workpiece in accordance with an embodiment of the invention.

FIG. 4 is a flow chart of a method 400 for forming interconnects in the workpiece. The method 400 can be generally similar to the method 300 described above, except that the method 400 is directed specifically at constructing interconnects in through-holes. The method 400 first includes forming a through-hole in the workpiece at stage 410. The through-hole is etched or cut with a laser completely through the workpiece. If a laser is used, then at stage 415 the through-hole will be cleaned to remove the ablated byproducts (i.e., slag) and/or other undesirable byproducts resulting from the laser. At stage 420, the method 400 includes forming a dielectric liner in the through-hole. In several embodiments, one or more conductive layers can be deposited onto the dielectric liner at optional stage 425. A wetting agent is applied to the dielectric liner (or the optional conductive layer) at stage 430. In several embodiments, the method 400 can include a spacer etch at optional stage 435 to remove material (e.g., the dielectric liner and/or wetting agent) from surfaces that are transverse (i.e., not parallel) relative to the direction of the etchant. At stage 440, the method 400 includes depositing solder into the through-hole to form an interconnect. Finally, the end of the interconnect is capped at stage 450 to electrically couple the interconnect to the corresponding terminal.

Figure 5A:
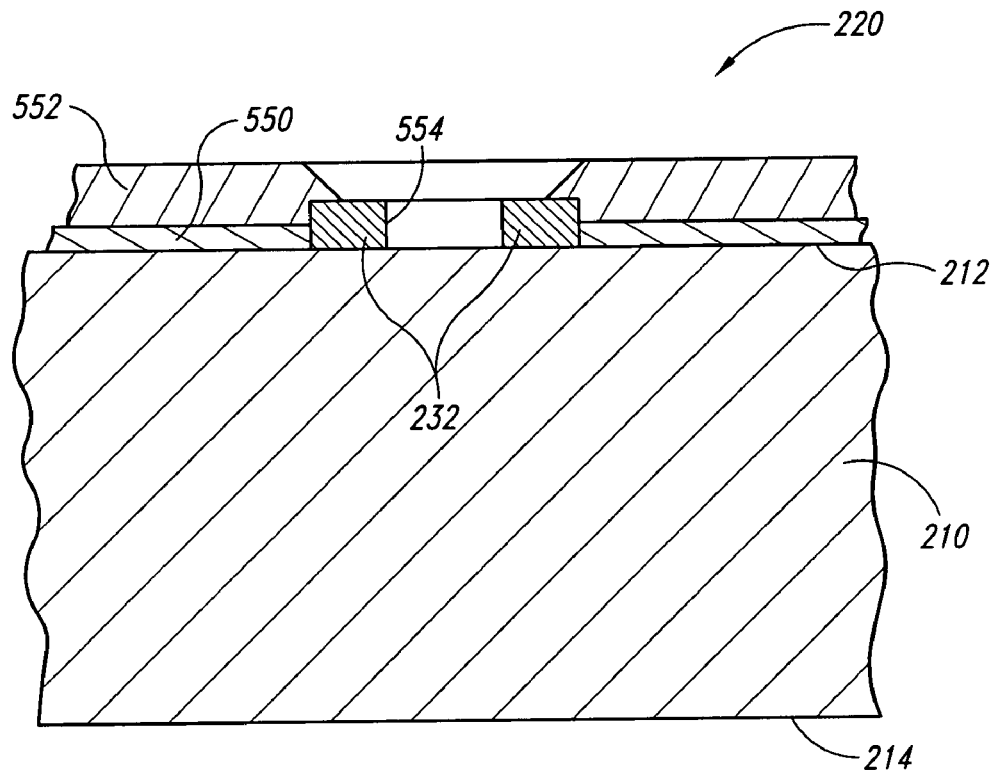
FIGS. 5A-5G are schematic side cross-sectional views illustrating a method for forming an electrically conductive through-wafer interconnect for providing a backside array of contact pads in accordance with an embodiment of the invention.

FIGS. 5A-5G are schematic side cross-sectional views illustrating one embodiment of method 400 (FIG. 4) in greater detail. FIG. 5A, more specifically, is a schematic side cross-sectional view of the area for one of the external contacts 230 shown in FIG. 2. In this embodiment, a first dielectric layer 550 is applied to the front side 212 of the substrate, and a second dielectric layer 552 is applied over the first dielectric layer 550. The second dielectric layer 552 is patterned and etched to expose the terminal 232. After exposing the terminal 232, a first hole 554 is formed through the terminal 232. The first hole 554 can be formed by etching the center of the terminal 232, but in other embodiments the first hole 554 can be formed using other suitable methods (e.g., laser). The dielectric layers 550 and 552 can be a polyimide material, but these dielectric layers can also be other nonconductive materials in other embodiments. For example, the first dielectric layer 550 and/or one or more of the subsequent dielectric layers can be a low temperature chemical vapor deposition (low temperature CVD) material, such as tetra-ethylorthosilicate (TEOS), parylene, silicon nitride ($Si_3N_4$), silicon oxide ($SiO_2$), and/or other suitable materials. The foregoing list of dielectric materials is not exhaustive. The dielectric layers 550 and 552 are not generally composed of the same material. In addition, one or both of these layers may be omitted.

Figure 5B:
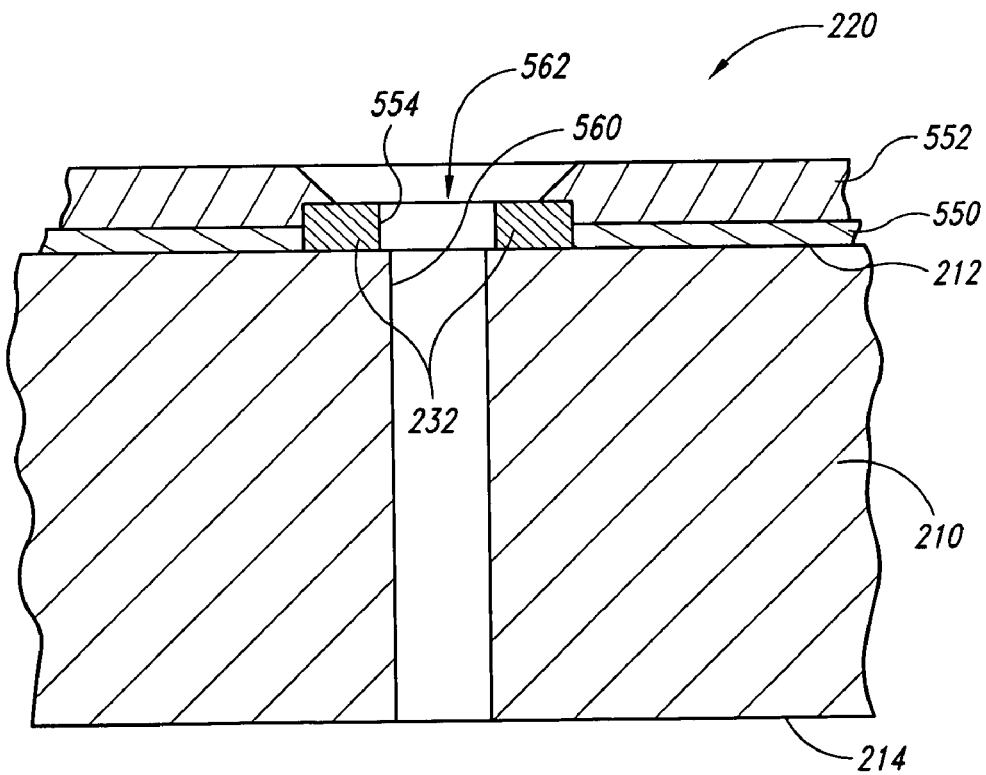

Referring to FIG. 5B, a passage or through-hole 560 is then cut through the substrate 210. The through-hole 560 extends through the substrate 210 to the first hole 554 in the terminal 232. The through-hole 560 and the first hole 554 together form a passage 562 extending through the die 220. The through-hole 560 can be formed by etching through the material using one or more etches. The through-hole 560 can alternatively be formed using a laser, as described below in FIG. 6B, in addition to or in lieu of etching.

Although laser cutting the through-hole 560 may be advantageous because the substrate 210 does not need to be patterned, etching the through-hole 560 may be easier because the slag does not need to be cleaned from the through-hole 560. Another advantage of etching the through-hole 560 is that the through-hole 560 has rounded corners, which reduce stress points within the hole so that an interconnect constructed within the hole is less susceptible to stress damage. A further advantage of using an etching process is that the front side 212 of the substrate 210 can be patterned and etched to simultaneously form a plurality of through-holes 560 aligned with corresponding terminals 232.

Figure 5C:
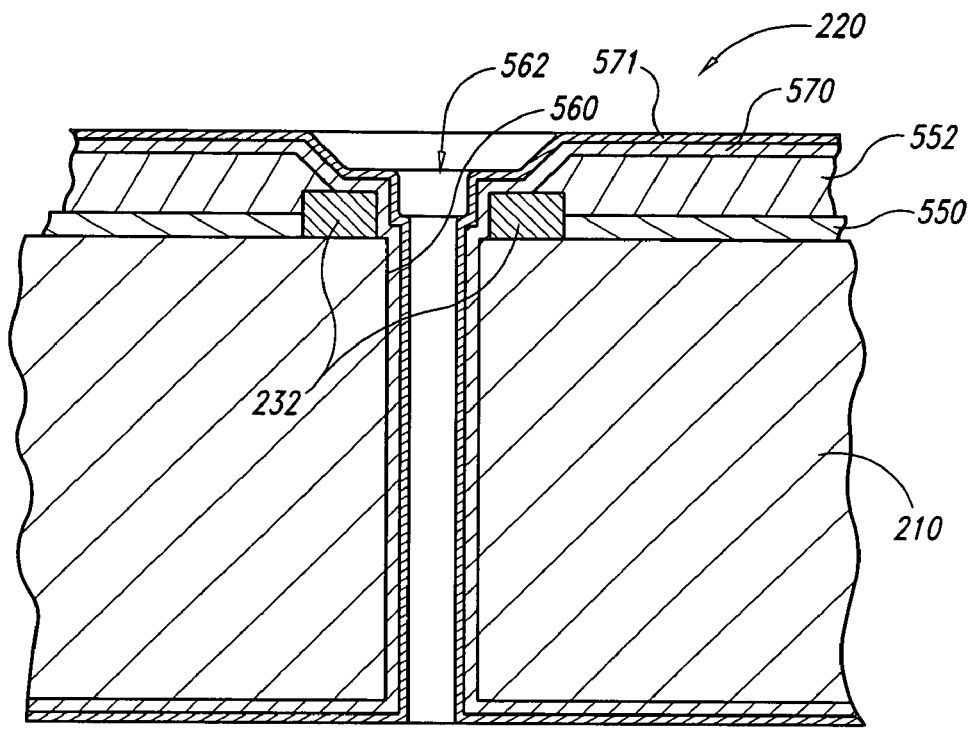

Referring next to FIG. 5C, a third dielectric layer 570 is applied to the die 220 to line the sidewall of the through-hole 560 in the substrate 210. The third dielectric layer 570 is an isolation material that electrically insulates the components of the substrate 210 from an interconnect that is subsequently formed in the passage 562 as described in greater detail below. In the illustrated embodiment, the third dielectric layer 570 not only lines the exposed portions of the substrate 210 in the through-hole 560, but it also covers the terminal 232 and the second dielectric layer 552. The third dielectric layer 570 can be a low temperature CVD oxide. In one embodiment, for example, the third dielectric layer 570 is an aluminum-rich oxide material applied using a pulsed layer deposition process. In another embodiment, the third dielectric layer 570 includes a silane-based oxide material. In still further embodiments, the third dielectric layer 570 can include other suitable dielectric materials. A barrier layer 571 is then deposited onto the substrate 210 over the third dielectric layer 570. The barrier layer 571 can be deposited onto the substrate 210 using a vapor deposition process, such as CVD or physical vapor deposition (PVD). The barrier layer 571 can be composed of W, Ta, or other suitable materials.

Figure 5D:
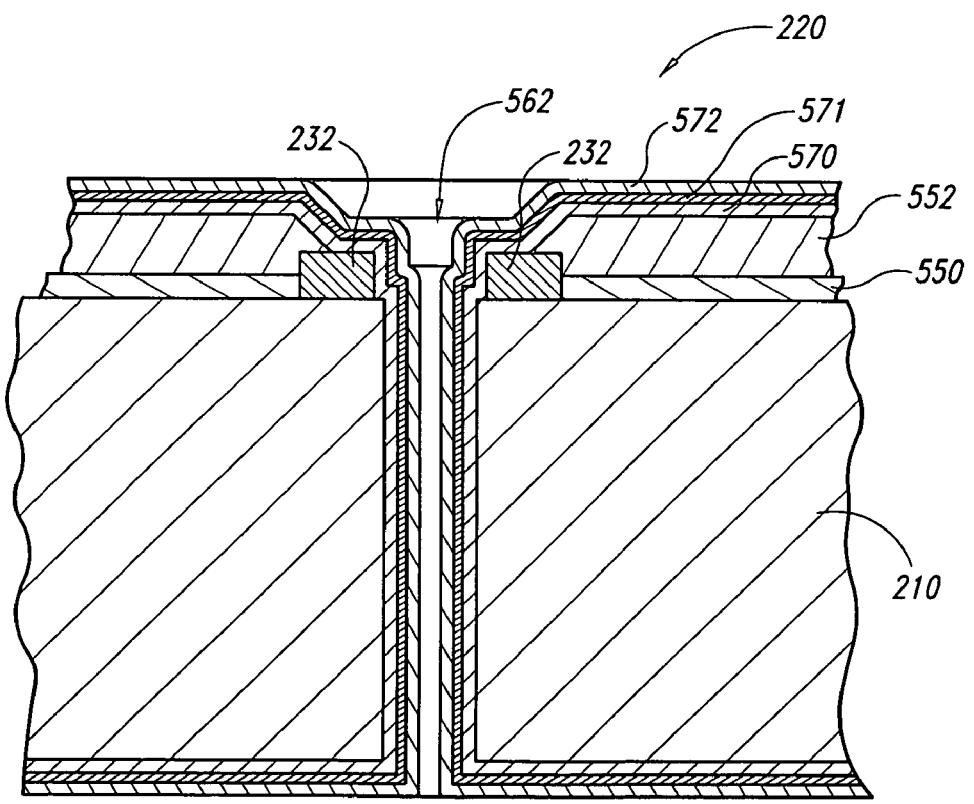

Referring to FIG. 5D, a first conductive layer 572 is deposited onto the die 220. In the illustrated embodiment, the first conductive layer 572 covers the barrier layer 571. The first conductive layer 572 is generally a wetting agent to facilitate depositing a conductive fill material into the passage 562. In one embodiment, the first conductive layer 572 is nickel (Ni). In other embodiments, the first conductive layer 572 may be another suitable material and/or the passage 562 can be coated with one or more additional layers. For example, additional layers may be added to the third dielectric layer 570 before application of the first conductive layer 572. In several embodiments, a seed layer and/or additional conductive layers can be deposited onto the barrier layer 571 before the application of the first conductive layer 572. Suitable materials and methods for applying the seed layer and additional conductive layer are described below with respect to FIGS. 9D and 9E.

Figure 5E:
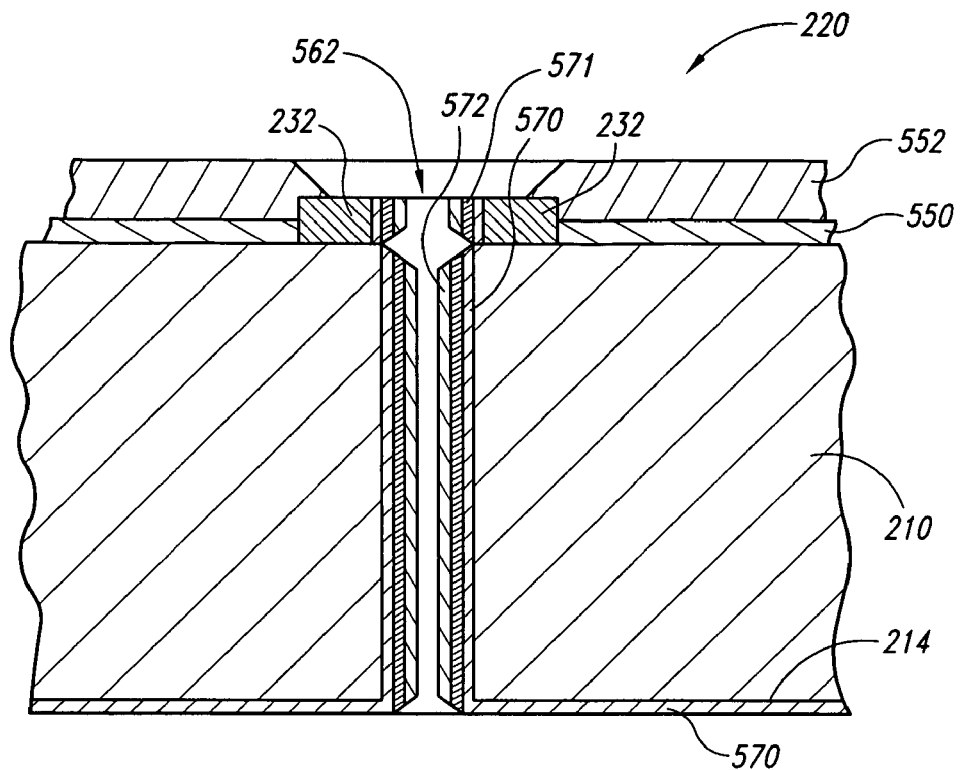

Referring next to FIG. 5E, the first conductive layer 572 is etched to leave a portion of the first conductive layer 572 lining the passage 562. The first conductive layer 572 can be etched using a "dry etch" or "spacer etch" that preferentially removes material from surfaces that are transverse (i.e., not parallel) relative to the direction of the etchant. In this embodiment, the vertical portions of the first conductive layer 572 remain on the barrier layer 571 and the third dielectric layer 570 in the passage 562.

Figure 5F:
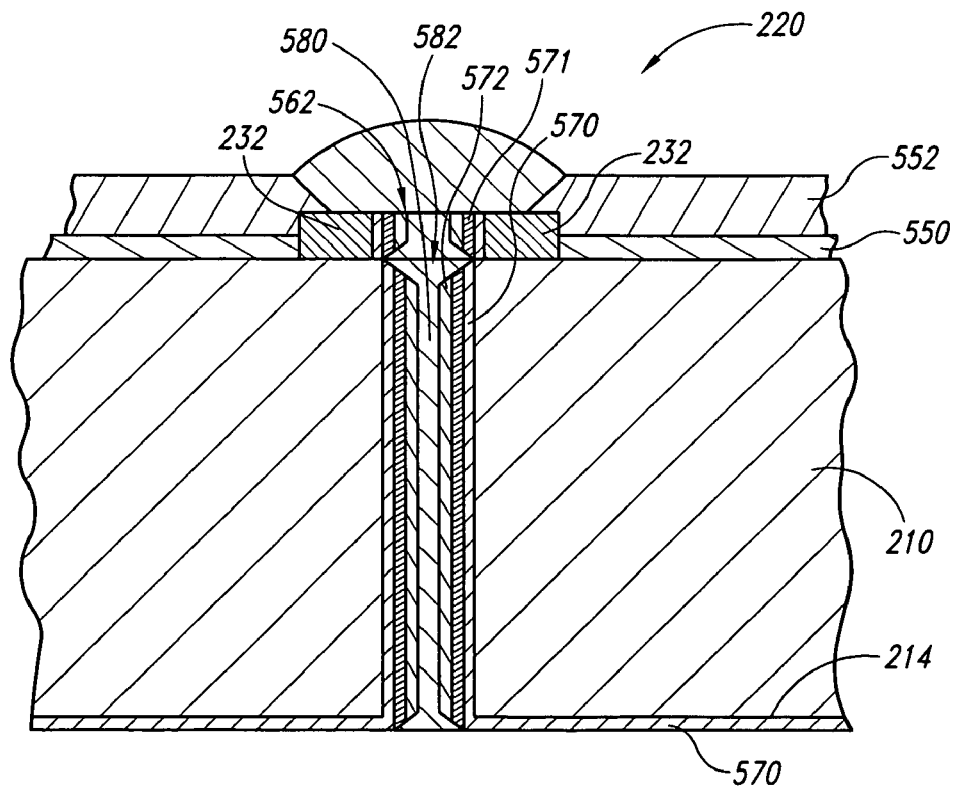

Referring next to FIG. 5F, a conductive fill material 580 is deposited into the passage 562 to form an interconnect 582 extending through the die 220. In one embodiment, the fill material 580 is SnAgCu solder deposited into the passage 562 using a vacuum reflow process. In other embodiments, the fill material 580 can be SnPb solder or solder materials having other compositions. Additionally, the fill material 580 may be deposited into the passage 562 using other methods, such as solder wave solder, plating solder, screen printing a solder plate, placing a pre-formed sphere of solder in the passage 562 and melting the sphere, injecting a solder paste or molten solder into the passage 562, or other suitable methods known to those of skill in the art.

Figure 5G:
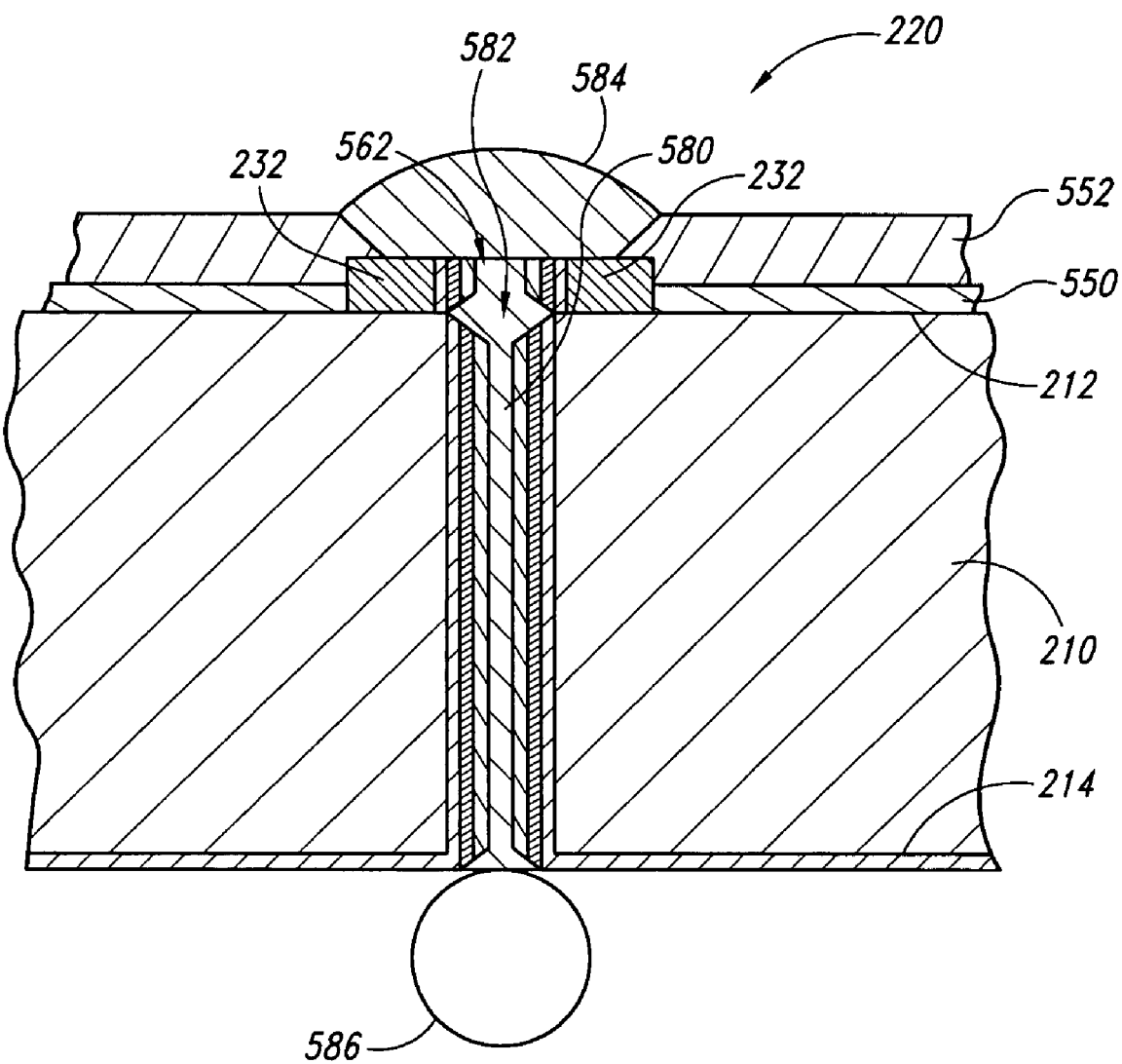

Referring next to FIG. 5G, a cap 584 is formed at one end of the interconnect 582 to electrically couple the interconnect 582 to the terminal 232. In one embodiment, the cap 584 is Ni that is plated onto the interconnect 582. Alternatively, the cap 584 can be omitted by overfilling the passage 562 with the fill material 580 such that the fill material itself forms a connection to the terminal 232. A solder ball 586 or other external interconnect structure can be attached to the interconnect 582 at the backside 214 of the substrate 210 to provide an external connection to other electronic devices on the backside of the die 220.

One feature of the method described above with reference to FIGS. 5A-5G is that the passage 562 extends through the entire die 220. The passage 562 is accordingly easier to clean and fill than would otherwise be the case in certain situations when the passage is "blind" (i.e., a passage that extends only partially through the workpiece).

Another feature of the method described above in FIGS. 5A-5G is that the fill material 580 is solder. Solder is relatively inexpensive, and machinery and processes for working with solder are well known in the semiconductor arts. Furthermore, solder can be deposited into the passage 562 at fairly low temperatures, which is advantageous because high temperatures can damage the various microelectronic components on and/or in the workpiece.

Figure 6A:
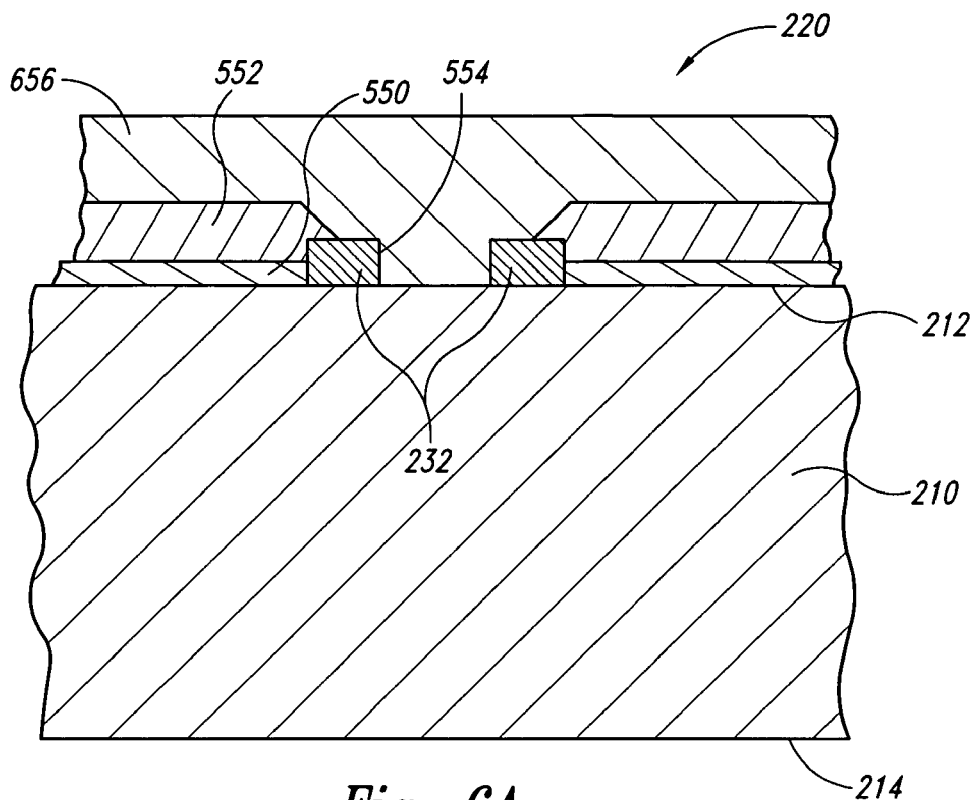
FIGS. 6A-6F are schematic side cross-sectional views illustrating a method for forming an electrically conductive through-wafer interconnect for providing a backside array of contact pads in accordance with another embodiment of the invention.

FIGS. 6A-6F are schematic side cross-sectional views illustrating a method for forming a through-wafer interconnect in accordance with another embodiment of method 400 (FIG. 4). Referring first to FIG. 6A, the first part of this method is similar to the steps described above with reference to FIG. 5A. The method shown in FIG. 6A, however, differs from that described above in FIG. 5A in that a third dielectric layer 656 is deposited onto the die 220 to cover the terminal 232 and fill the first hole 554 before cutting a through-hole through the substrate 210.

Figure 6B:
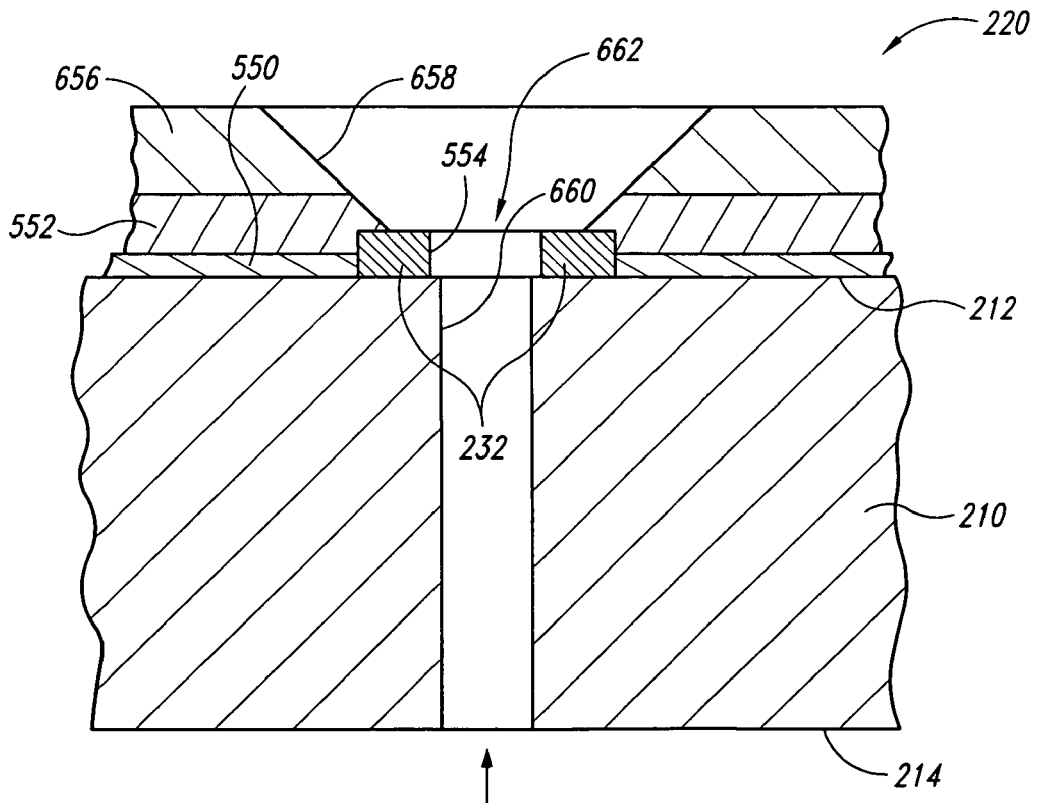

Referring next to FIG. 6B, a second hole 658 is etched through the third dielectric layer 656 to expose the terminal 232. The second hole 658 is typically etched to the front side 212 of the substrate 210 to open the first hole 554. A passage or through-hole 660 is then cut through the first substrate 210. The through-hole 660 extends through the substrate 210 to the first hole 554 in the terminal 232. The through-hole 660 and the first hole 554 together form a passage 662 extending through the die 220. In the illustrated embodiment, the through-hole 660 can be formed using a laser (shown schematically) to cut through the substrate 210 from the backside 214 toward the front side 212. In a different embodiment, the laser can conceivably cut from the front side 212 toward the backside 214. The laser can be aligned with respect to the terminal 232 using scanning/alignment systems known in the art.

After forming the through-hole 660, it is cleaned to remove ablated byproducts (i.e., slag) and/or other undesirable byproducts resulting from the laser. Suitable chemical cleaning agents and processes are disclosed in U.S. patent application Ser. No. 10/879,398, which was previously incorporated by reference. The slag in the through-hole 660, however, may not be cleaned in some embodiments of this method.

Figure 6C:
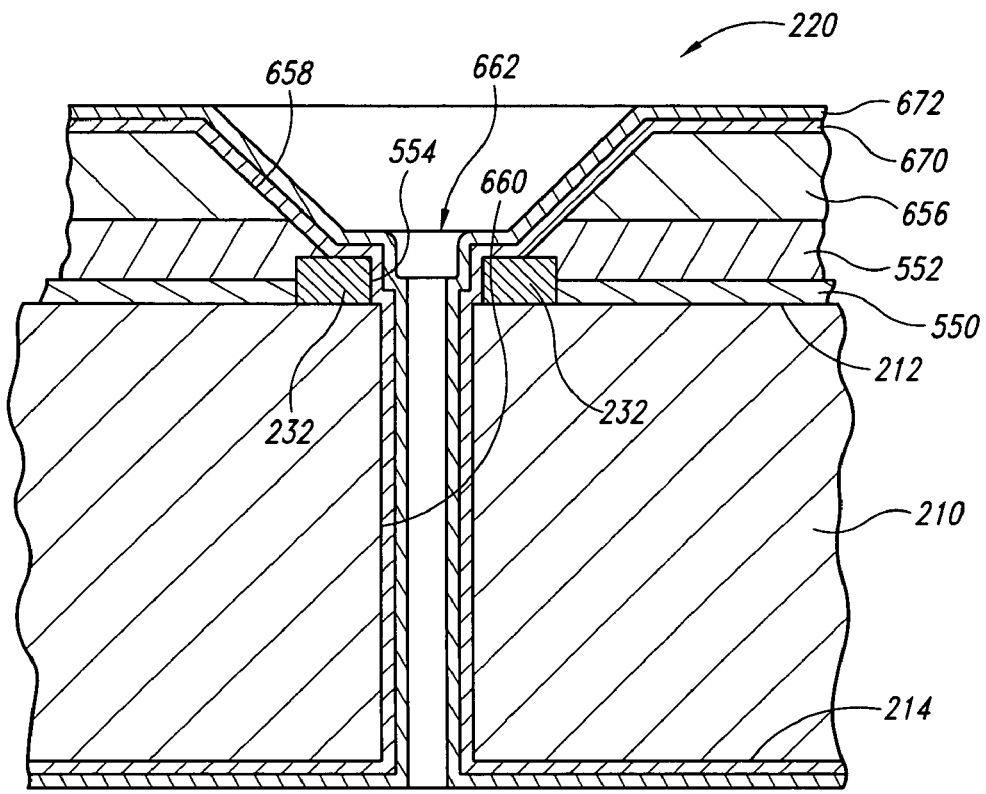

Referring to FIG. 6C, a fourth dielectric layer 670 is applied to the die 220 to line the sidewall of the through-hole 660 in the substrate 210. The fourth dielectric layer 670 can be applied using CVD, PVD, atomic layer deposition (ALD), or other deposition processes. In the illustrated embodiment, the fourth dielectric layer 670 not only lines the exposed portions of the substrate 210 in the through-hole 660, but it also covers the terminal 232 and the third dielectric layer 656. The fourth dielectric layer 670 can be a low temperature CVD oxide, but in other embodiments the fourth dielectric layer 670 can be other suitable dielectric materials. The fourth dielectric layer 670 electrically insulates the components of the substrate 210 from an interconnect that is subsequently formed in the passage 662 as described in greater detail below.

After applying the fourth dielectric layer 670, a first conductive layer 672 is deposited onto the die 220. In the illustrated embodiment, the first conductive layer 672 covers the fourth dielectric layer 670. The first conductive layer 672 is generally composed of a metal, such as TiN, but in other embodiments the first conductive layer 672 can be composed of other suitable materials known to those of skill in the art. As explained below, the first conductive layer 672 provides a seed layer for plating another layer of metal into the passage 662.

Figure 6D:
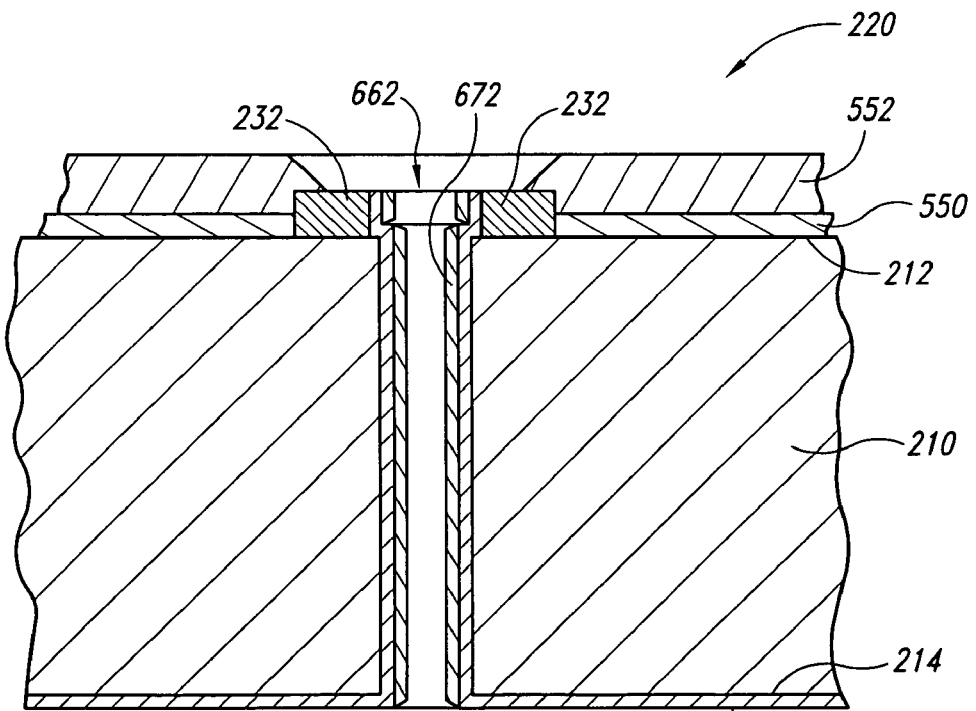

Referring next to FIG. 6D, the first conductive layer 672 is etched from the horizontal and diagonal surfaces of the die 220 using a spacer etch or other process as described above with respect to FIG. 5E. The front side of the fourth dielectric layer 670 is then etched to remove the fourth dielectric layer 670 from the horizontal and diagonal surfaces of the front side 212 of the die 220, and then the third dielectric layer 656 (FIG. 6C) is removed from the die 220. The fourth dielectric layer 670 remains under the first conductive layer 672 in the passage 662 and on the backside 214 of the substrate 210 in this embodiment. The fourth dielectric layer 670 can be etched using a dry etch or spacer etch as described above. The third dielectric layer 656 can be removed using a suitable isotropic or anisotropic etch, a washing process, or a chemical mechanical planarization (CMP) process depending on the composition of the third dielectric layer 656. The etch of the third dielectric layer 656 (FIG. 6C) should be terminated before etching through the second dielectric layer 552.

Figure 6E:
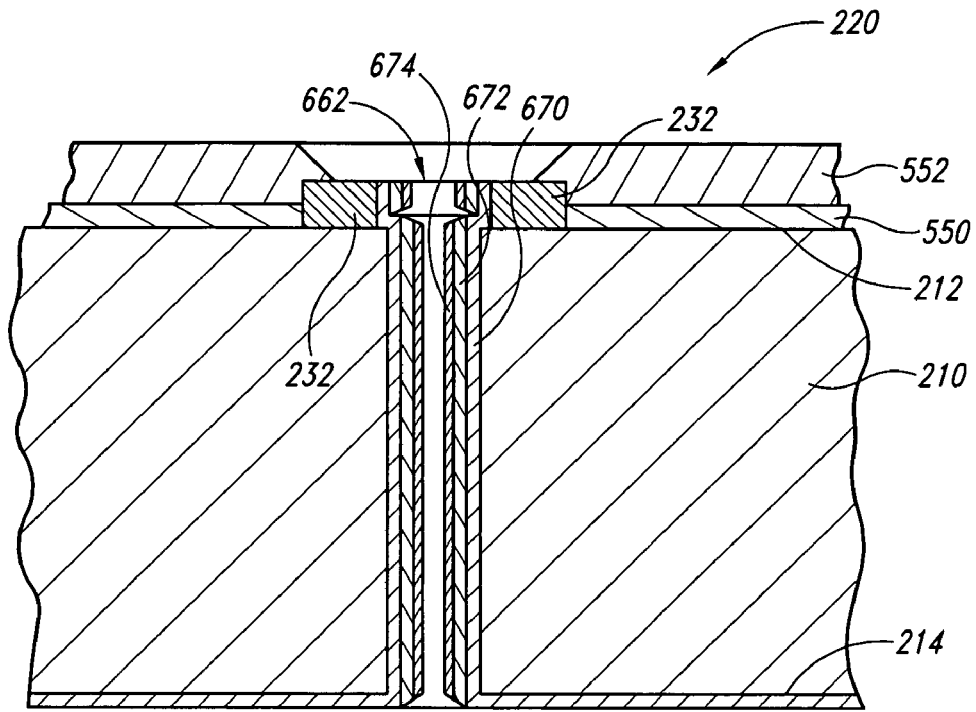

Referring to FIG. 6E, a second conductive layer 674 is deposited onto the remaining portions of the first conductive layer 672 in the passage 662. The second conductive layer 674 is generally a wetting agent to facilitate depositing metals into the passage 662. In one embodiment, the second conductive layer 674 is Ni and the first conductive layer 672 is TiN so that the Ni can be plated onto the TiN using a suitable electroless plating process. In other embodiments, the passage 662 can be coated with other suitable materials using other methods, or one or more of the first and second conductive layers 672 and 674 may be omitted.

Figure 6F:
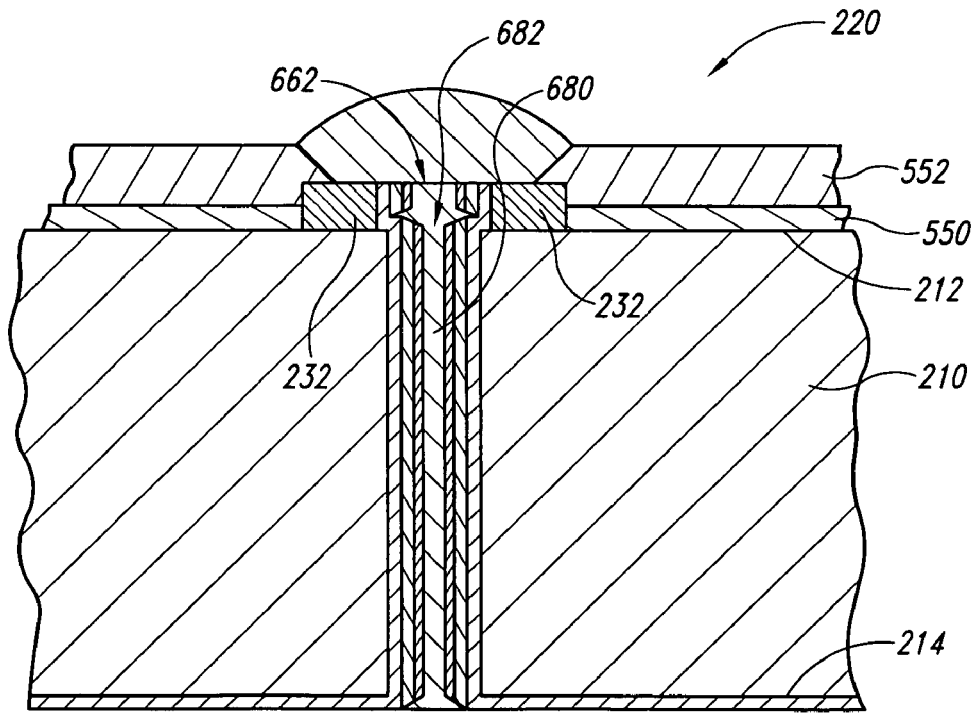

Referring next to FIG. 6F, a conductive fill material 680 is deposited into the passage 662 to form an interconnect 682 extending through the die 220. In one embodiment, the fill material 680 can include a SnPb solder deposited into the passage 662 using a solder wave process. In alternative embodiments, the fill material 680 may be a solder material having a different composition or another suitable electrically conductive material. Further, the fill material 680 may be deposited into the passage 662 using other methods.

Figure 7A:
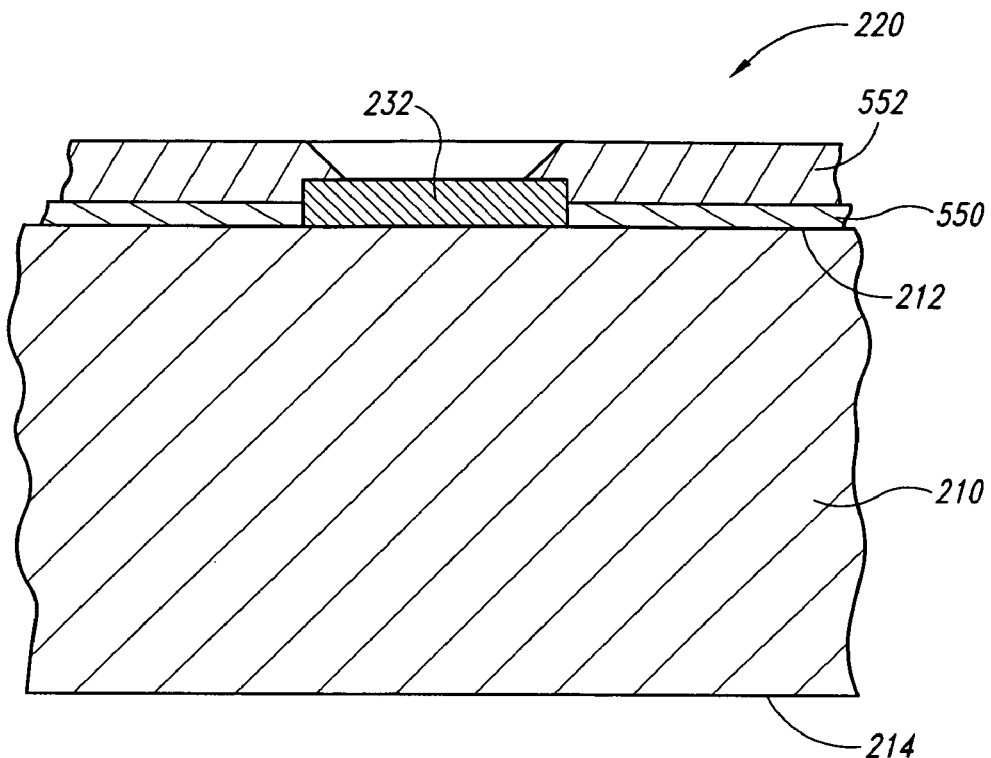
FIGS. 7A and 7B are schematic side cross-sectional views illustrating a method for forming an electrically conductive through-wafer interconnect for providing a backside array of contact pads in accordance with yet another embodiment of the invention.
Figure 7B:
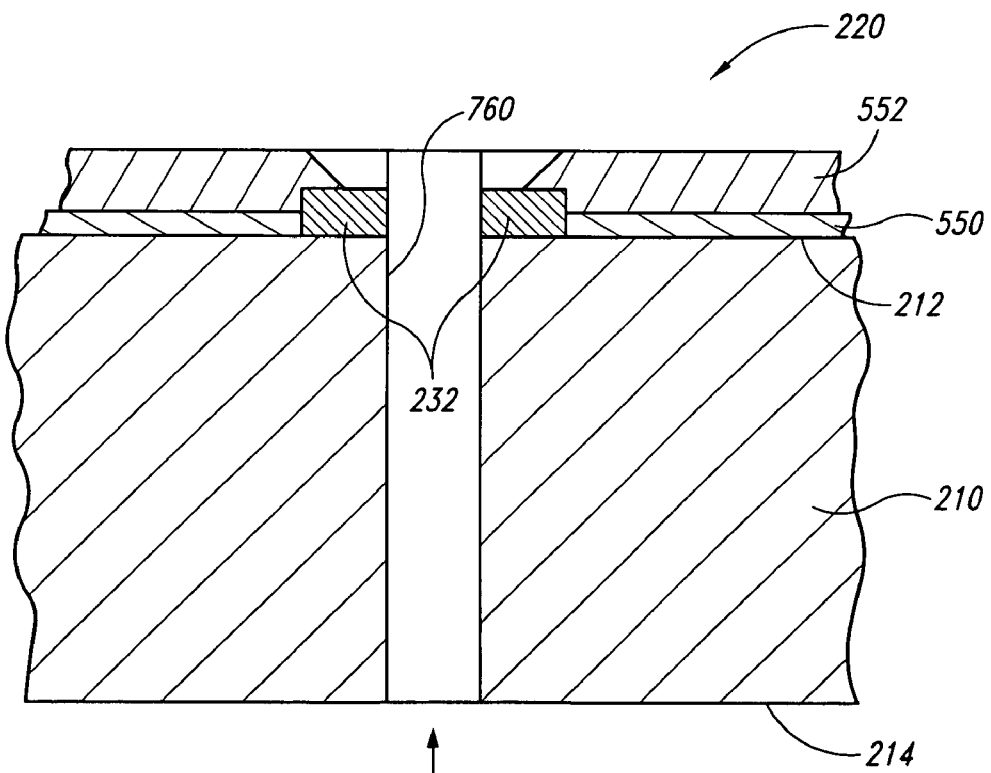

FIGS. 7A and 7B illustrate another method for forming an interconnect in accordance with yet another embodiment of the invention. Referring first to FIG. 7A, the first part of this method is similar to the steps described above with reference to FIG. 5A, but a hole is not etched in the terminal 232. Referring next to FIG. 7B, a through-hole 760 is formed through both the substrate 210 and the terminal 232. The through-hole 760 can be formed using a laser (shown schematically), etching, or another suitable process. When the through-hole 760 is formed using a laser, a first type of slag (i.e., silicon) can coat the portion of the sidewall in the substrate 210 and a second type of slag (i.e., metal) can coat the portion of the sidewall in the terminal 232. As such, it may take two separate cleaning steps to clean the through-hole 760. In general, the cleaning agents used to clean the through-hole 760 may be limited to chemistries that do not attack or otherwise degrade either the terminal 232 or the substrate 210. After the through-hole 760 has been suitably cleaned, the die 220 can undergo additional steps that are at least generally similar to those described above with reference to FIGS. 5C-5G or FIGS. 6C-6F to construct a through-wafer interconnect.

The embodiments described above with reference to FIGS. 5A-7B include three methods for forming and/or filling through-holes in microelectronic workpieces that extend through bond-pads and/or associated substrates. In other embodiments, other methods can be used to form and/or fill such through-holes. Accordingly, the present invention is not limited to the particular methods for forming and/or filling the through-holes described above, but it also includes alternative methods for providing an electrically conductive material in a through-hole to form an array of ball-pads on the backside of the die.

E. Methods for Forming Interconnects in Blind Holes

FIGS. 8-14 illustrate additional methods for constructing the interconnects 236 shown in FIG. 2. The methods shown in FIGS. 8-14 are related to those shown above in FIGS. 4-7B, but form an interconnect in a blind hole or via in the substrate 210 instead of a through-hole extending through the substrate. Each of the embodiments described below can be used for implementing each of the examples set forth above with respect to FIG. 3.

Figure 8:
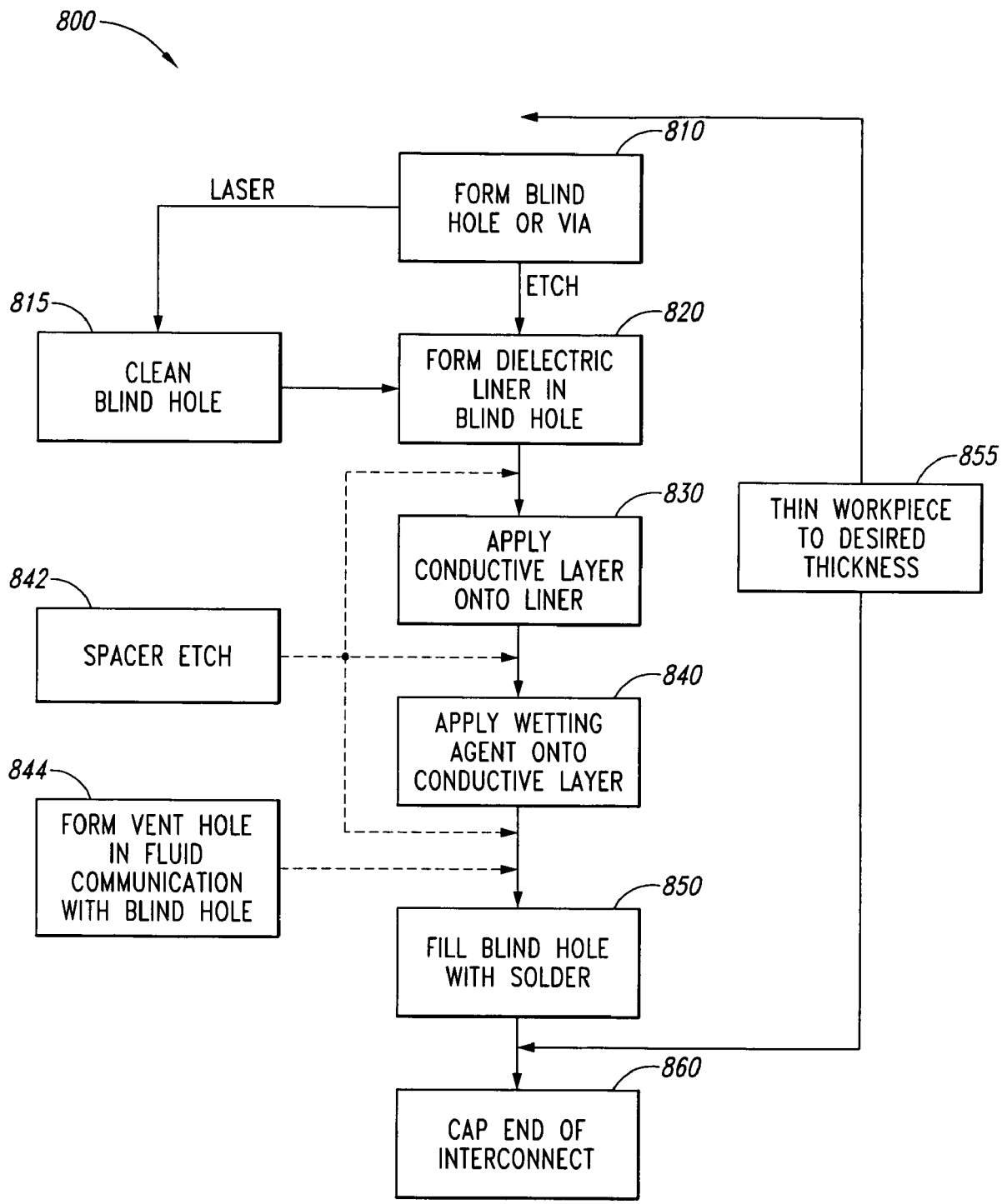
FIG. 8 is flow chart illustrating a method for forming an electrically conductive interconnect in a blind hole in the microelectronic workpiece in accordance with an embodiment of the invention.

FIG. 8 is a flow chart of a method 800 for forming interconnects in blind holes in a microelectronic workpiece. The method 800 can be generally similar to the method 300 described above with respect to FIG. 3, except that the method 800 is directed specifically at constructing interconnects in blind holes or vias. The method 800 first includes forming a blind hole or blind via that does not extend completely through the workpiece at stage 810. The blind hole can be etched or cut with a laser. If a laser is used, then at stage 815 the blind hole is cleaned to remove the slag and/or other undesirable byproducts resulting from the laser. At stage 820, the method 800 includes forming a dielectric liner in the blind hole. A conductive layer is then deposited onto the dielectric liner at stage 830, and a wetting agent is applied to the dielectric liner at stage 840. In several embodiments, a first optional stage 842 includes a spacer etch to remove material (e.g., the dielectric liner, conductive layer, and/or wetting agent) from non-vertical surfaces. A second optional stage 844 includes forming a vent hole in fluid communication with the blind hole. The vent hole, which can be formed in the workpiece or a support member attached to the workpiece, extends to the blind hole to vent fluids or other gases that could otherwise be trapped in the blind hole. The method 800 continues at stage 850 by depositing solder into the blind hole to form an interconnect. A third optional stage 855 includes thinning the workpiece. The optional thinning stage 855 can occur before forming the blind holes in stage 810 or after filling the blind holes with the conductive material in stage 850. Finally, an end of the interconnect is capped at stage 860 to electrically couple the interconnect to the corresponding terminal.

Figure 9A:
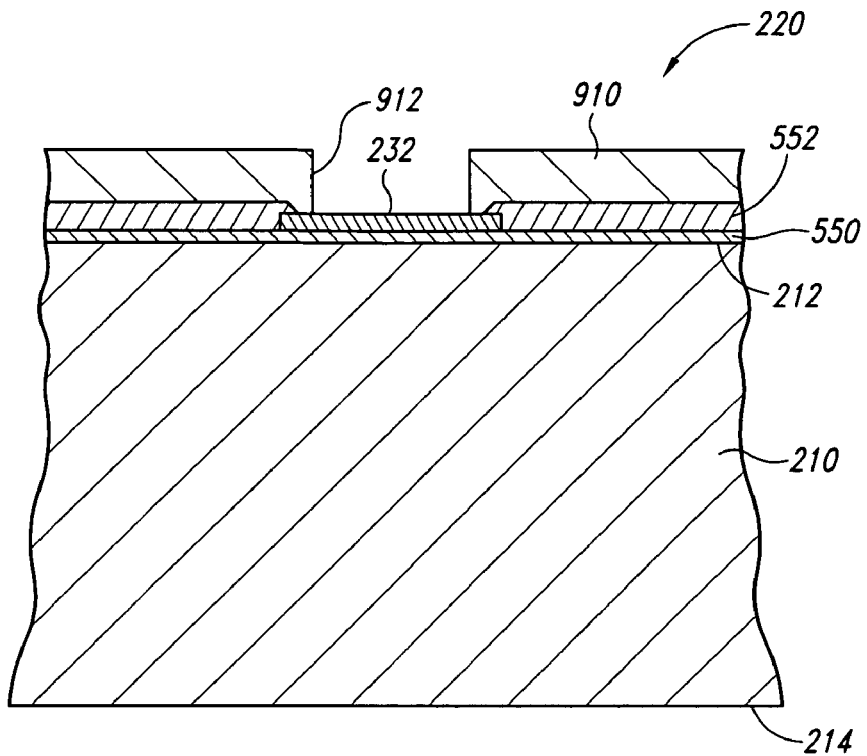
FIGS. 9A-9J are schematic side cross-sectional views illustrating a method for forming an electrically conductive through-wafer interconnect for providing a backside array of contact pads in accordance with another embodiment of the invention.

FIGS. 9A-9J are schematic side cross-sectional views illustrating one embodiment of method 800 in greater detail. FIG. 9A, more specifically, is a schematic side cross-sectional view of the area for one of the external contacts 230 shown in FIG. 2. In this embodiment, the first dielectric layer 550 is applied to the front side 212 of the substrate, and the second dielectric layer 552 is applied over the first dielectric layer 550. The second dielectric layer 552 is patterned and etched to expose the terminal 232. After depositing the second dielectric layer 552, a mask 910 is applied over the second dielectric layer 552 and patterned. The mask 910 can be a layer of resist that is patterned according to the arrangement of terminals 232 on the substrate 210. As such, the mask 910 has an opening 912 over the terminal 232.

Figure 9B:
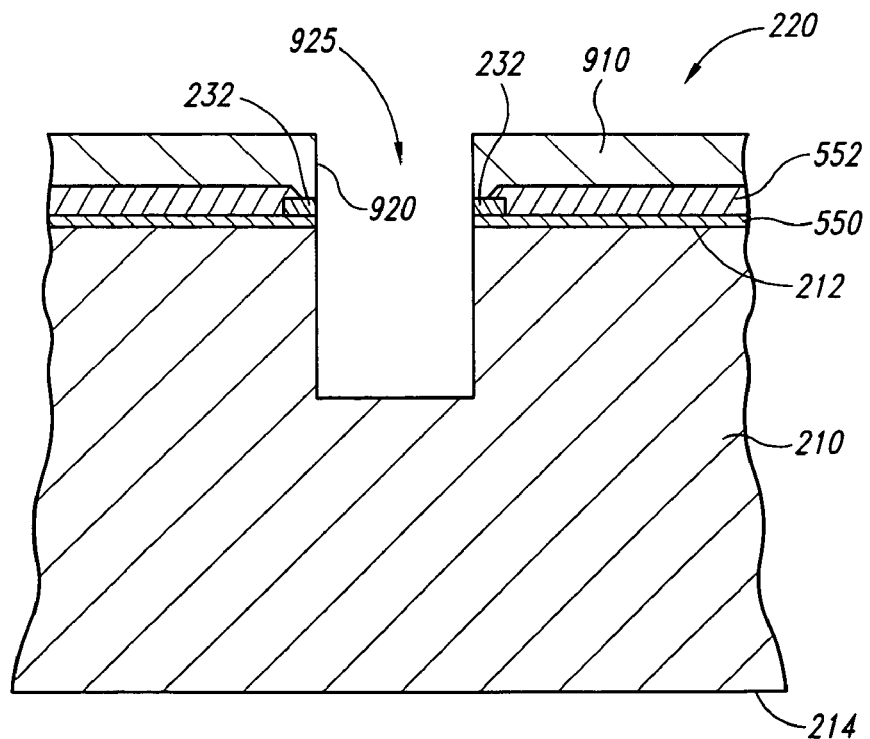

Referring to FIG. 9B, a hole or aperture 920 is formed through at least part of the substrate 210. The hole 920 extends through the terminal 232, the first dielectric layer 550, and a portion of the substrate 210 to define a blind hole or via 925. For purposes of this specification, a "blind hole" refers to a hole or aperture that extends only partially through the substrate 210 or is otherwise closed at one end. The hole 920 is formed by etching through the materials using one or more individual etches. After forming the hole 920, the mask 910 is removed from the die 220.

The hole 920 can alternatively be formed using a laser in addition to or in lieu of etching. If a laser is used to form all or a portion of the hole 920, it is typically cleaned using chemical cleaning agents to remove slag or other contaminants as described above with respect to FIG. 6B. Although laser cutting the hole 920 may be advantageous because the substrate 210 does not need to be patterned, etching the hole 920 may be easier because the slag does not need to be cleaned from the hole 920. Etching the hole 920 may also include many of the additional advantages described above with respect to etching through-holes in FIG. 5B.

Figure 9C:
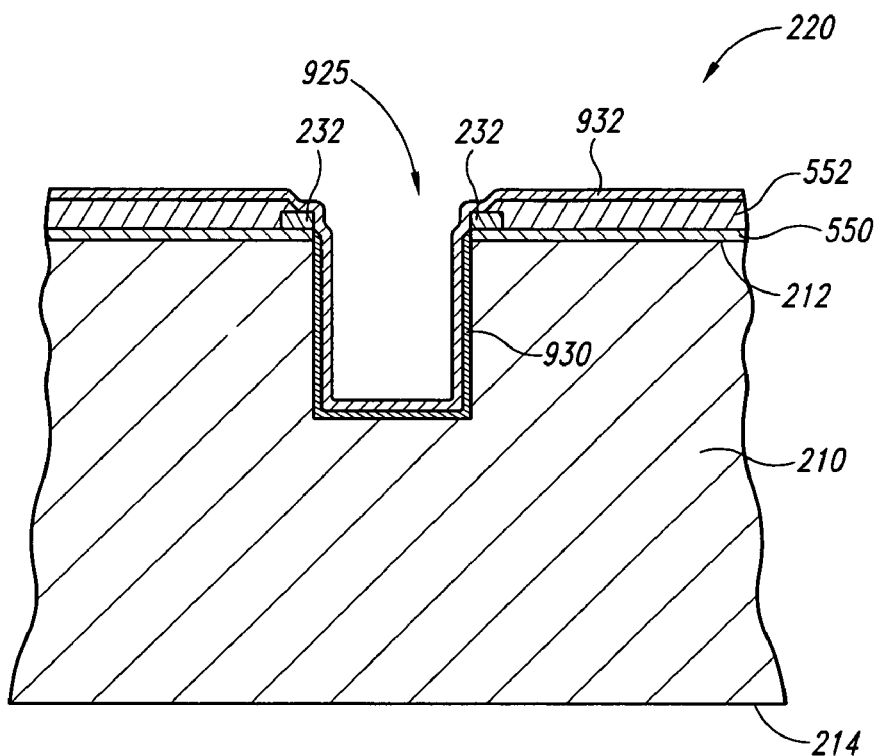

Referring next to FIG. 9C, a third dielectric layer 930 is deposited onto the substrate 210 to line the sidewalls of the blind hole 925 within the substrate 210. The third dielectric layer 930 electrically insulates components in the substrate 210 from an interconnect that is subsequently formed in the blind hole 925, as described in greater detail below. In one embodiment, the third dielectric layer 930 can be a low temperature CVD oxide applied using a pulsed layer deposition process similar to that described above with respect to FIG. 5C. In other embodiments, the third dielectric layer 930 can be a silane-based oxide material or other suitable dielectric materials. A barrier layer 932 is then deposited onto the substrate 210 over the third dielectric layer 930. In practice, the barrier layer 932 generally covers the second dielectric layer 552 and the terminal 232 in addition to the third dielectric layer 930. The barrier layer 932 can be deposited onto the substrate 210 using a vapor deposition process, such as CVD or PVD. The barrier layer 932 can be composed of W, Ta, or other suitable materials.

Figure 9D:
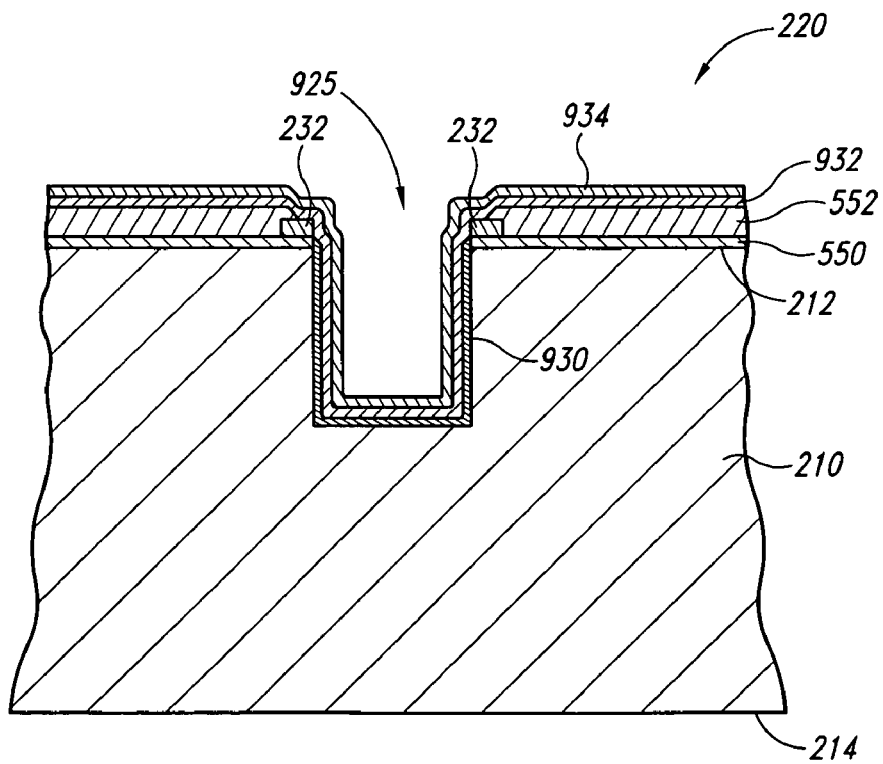

Referring next to FIG. 9D, a seed layer 934 is deposited onto the barrier layer 932. The seed layer 934 can be deposited using vapor deposition techniques, such as CVD, PVD, and/or ALD. The seed layer 934 can be composed of Cu or other suitable materials. The thickness of the seed layer 934 is generally 400 to 2000 Angstroms. The seed layer 934, however, may not cover the barrier layer 932 uniformly. This may cause subsequent electroplating processes to not apply a uniform metal layer onto the workpiece. If the seed layer 934 is deficient, it can be enhanced using an enhancement process that fills voids or noncontinuous regions of the seed layer 934 to form a more uniform seed layer. One suitable seed layer enhancement process is described in U.S. Pat. No. 6,197,181, which is incorporated by reference.

Figure 9E:
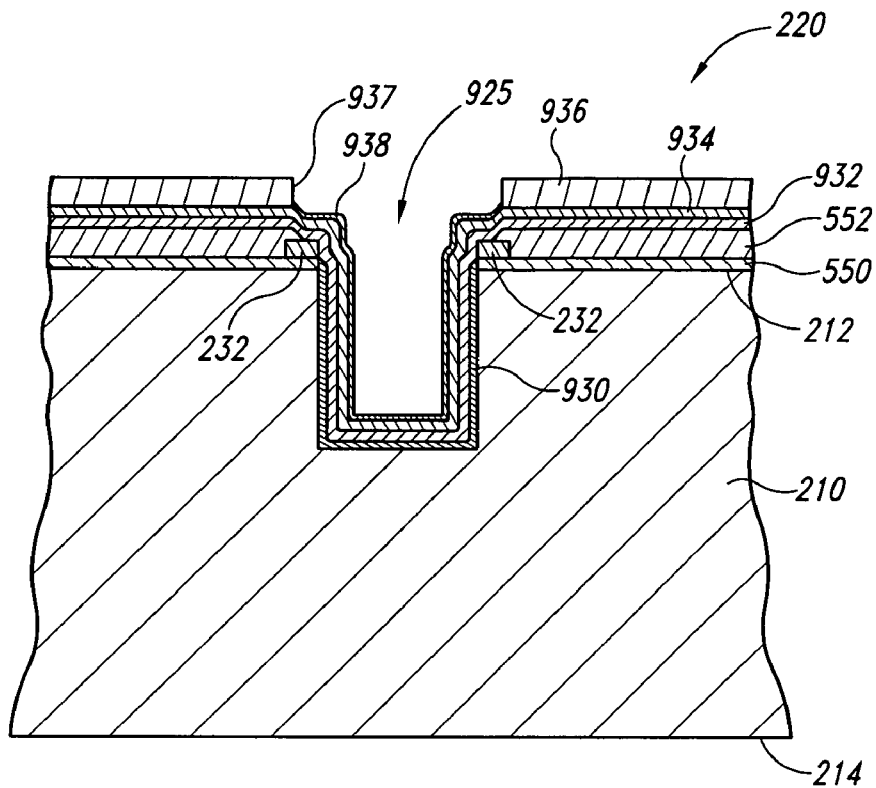

Referring next to FIG. 9E, a resist layer 936 is deposited onto the seed layer 934, and the resist layer 936 is patterned to have an opening 937 over the terminal 232 and corresponding blind hole 925. In several embodiments, a first conductive layer 938 can then be deposited onto the exposed portions of the seed layer 934 in the blind hole 925. The first conductive layer 938 can be Cu that is deposited onto the seed layer 934 in an electroless plating operation, electroplating operation, or another suitable method. The application of the first conductive layer 938 is an optional step that can be omitted in several embodiments.

Figure 9F:
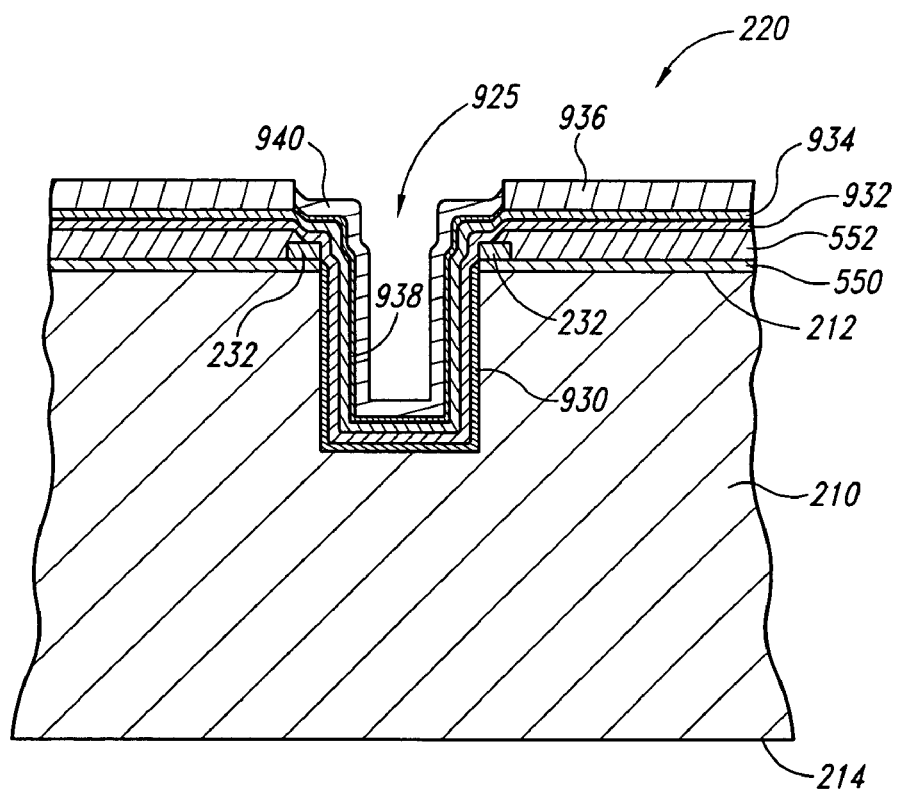

Referring to FIG. 9F, a second conductive layer 940 is deposited onto the first conductive layer 938 in the blind hole 925. The second conductive layer 940 is a wetting agent that facilitates depositing subsequent materials into the blind hole 925. The second conductive layer 940 can be Ni that is deposited onto the first conductive layer 938 using an electroless plating process. In other embodiments, the blind hole 925 may be coated with other suitable materials using other methods.

Figure 9G:
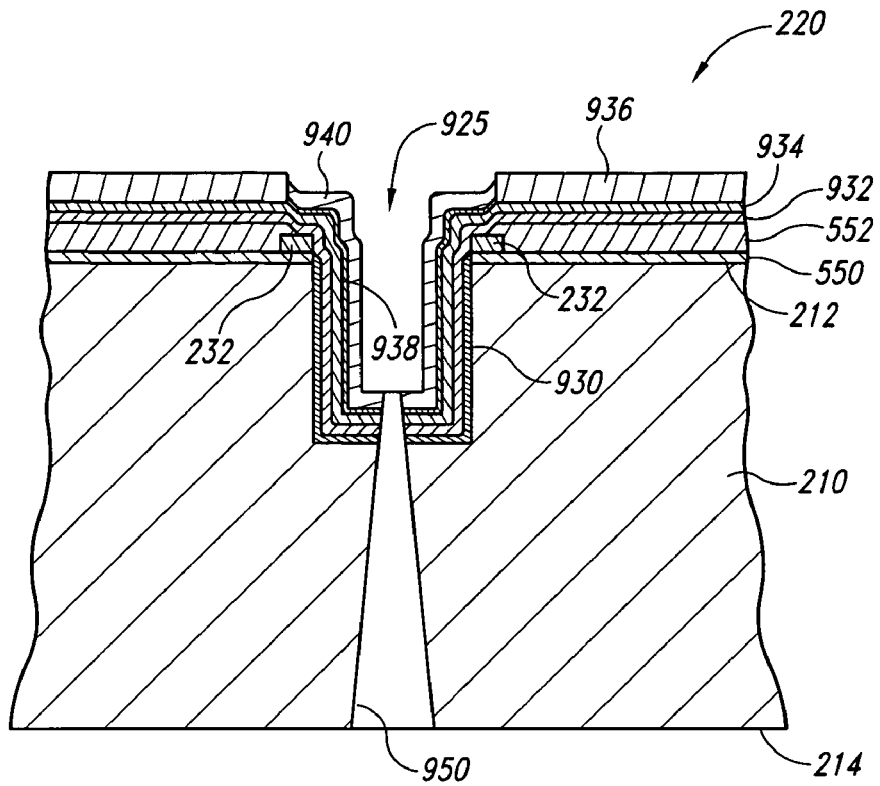

Referring next to FIG. 9G, a vent hole 950 is formed in the substrate 210 extending from a bottom portion of the blind hole 925 to the backside 214 of the substrate 210. The vent hole 950 can be formed using a laser to cut through the substrate 210 from the backside 214 to the bottom of the blind hole 925. The laser can be aligned with the blind hole 925 and/or corresponding terminal 232 using scanning/alignment systems known in the art. A suitable laser is the Xise200 commercially available from Xsil Ltd. of Dublin, Ireland. After forming the vent hole 950, it is generally cleaned to remove slag and/or other undesirable byproducts resulting from the laser. For example, the vent hole 950 can be cleaned using suitable cleaning agents described above with respect to FIG. 6B. In other embodiments, the vent hole 950 can be formed using an etching process or another suitable method. In alternative embodiments, the vent hole 950 may not be formed in the substrate 210 and/or the vent hole 950 may be formed at a different stage of the method.

Figure 9H:
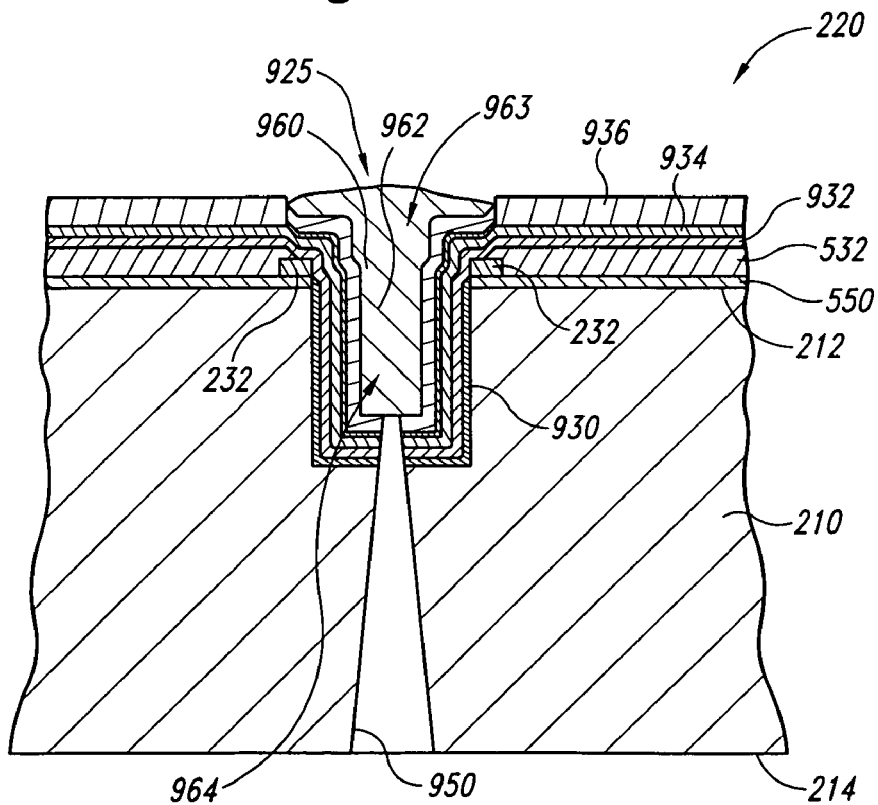

Referring next to FIG. 9H, a conductive fill material 960 is deposited into the blind hole 925 to form an interconnect 962. The interconnect 962 has a first end 963 proximate to the terminal 232 and a second end 964 at the bottom of the blind hole 925. In the illustrated embodiment, the fill material 960 is SnAgCu solder. In other embodiments, the fill material 960 can be SnPb solder, solder materials having other compositions, or another suitable material. The fill material 960 can be deposited into the blind hole 925 using plating processes, solder wave processes, screen printing processes, reflow processes, vapor deposition processes, or other suitable techniques. The plating processes, for example, can include electroless and/or electroplating processes. Several embodiments of methods for depositing the fill material 960 into the blind hole 925 are described below with respect to FIGS. 12A-14.

Figure 9I:
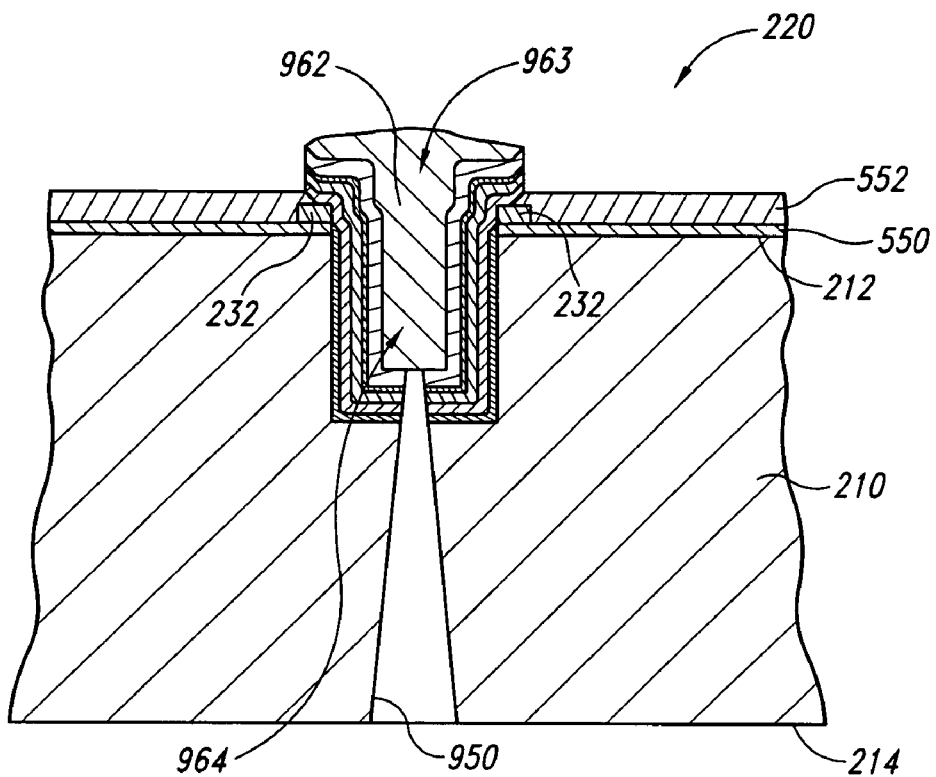
Figure 9J:
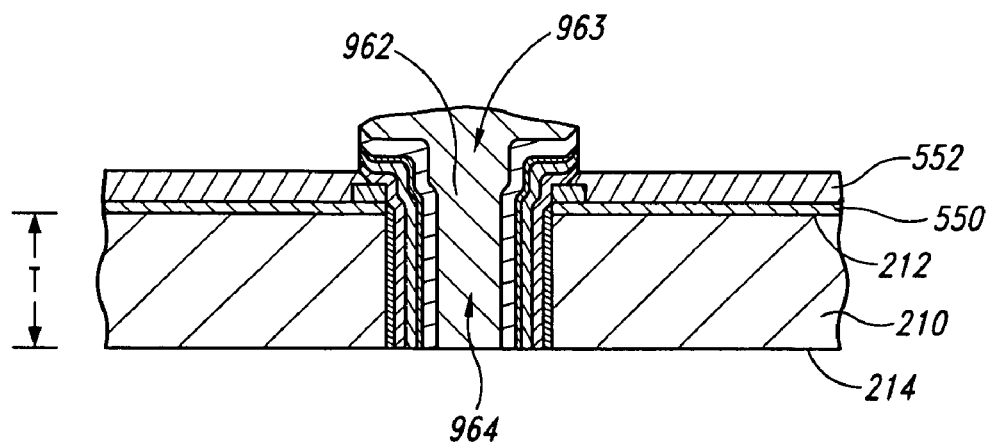

Referring to FIG. 9I, the resist layer 936 is removed from the substrate 210 and a suitable etching process is used to remove the remaining portions of the seed layer 934 and barrier layer 932 on the front side 212 of the substrate 210. Referring to FIG. 9J, the substrate 210 is thinned to a desired thickness "T" by removing material from the backside 214 of the substrate 210. In the illustrated embodiment, the second end 964 of the interconnect 962 is exposed after removing material from the backside 214. In one embodiment, the initial thickness of the substrate 210 is approximately 750 μm, and the final thickness T is approximately 100-500 μm. The initial and final thicknesses can be different in other embodiments. The backside 214 of the substrate 210 can be thinned using CMP processes, dry etching processes, chemical etching processes, chemical polishing, grinding procedures, or other suitable processes. In several embodiments, the substrate 210 can be recessed to bring out a solder "post" (not shown) after thinning the workpiece. The solder post is positioned to allow connection of the interconnect to solder balls, external devices, and/or boards.

One feature of the method described above with reference to FIGS. 9A-9J is that the vent hole 950 allows trapped air, gases, or volatile solvents to escape from the larger blind hole 925 when filling the blind hole with the fill material 960. In this way, the vent hole 950 allows the fill material 960 to more easily flow into the blind hole 925 and mitigates the likelihood of voids or discontinuities in the interconnect 962.

Another advantage of several embodiments of the method described above in FIGS. 9A-9J is that the vent hole 950 will not become plugged while depositing the fill material 960 into the blind hole 925. Because the vent hole 950 is formed after depositing the second conductive layer 940, the fill material 960 deposited into the blind hole 925 will only flow as far as the wetting material (e.g., the second conductive layer 940) and will not flow into the vent hole 950. Accordingly, the vent hole 950 will remain open during the filling process and allow any gases and/or fluids trapped in the blind hole 925 to escape.

Figure 10A:
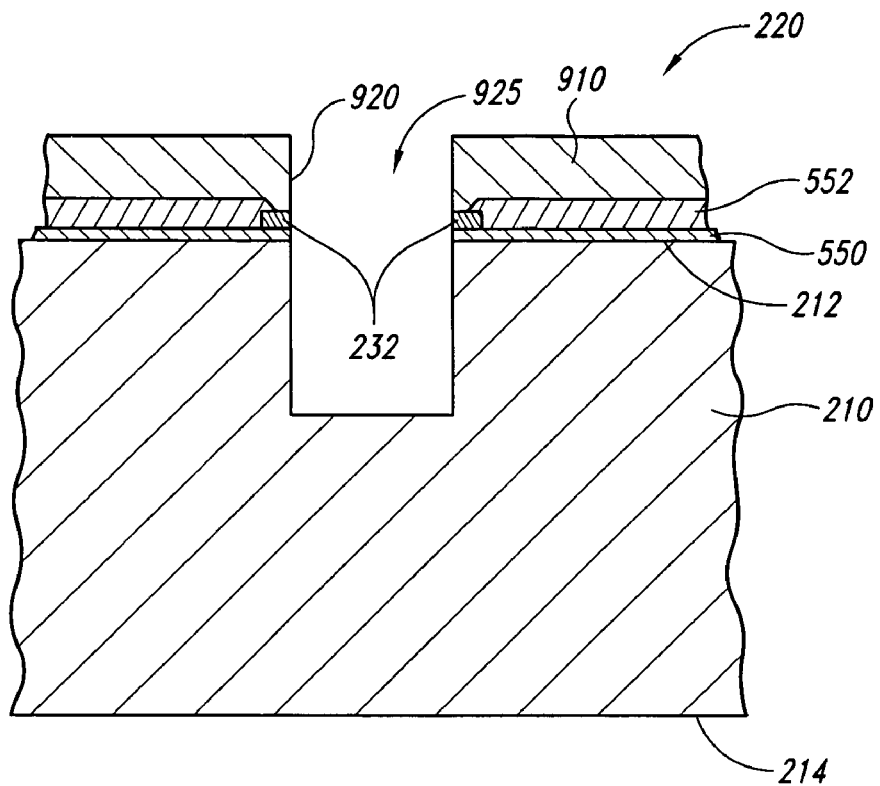
FIGS. 10A-10E are schematic side cross-sectional views illustrating a method for forming an electrically conductive through-wafer interconnect for providing a backside array of contact pads in accordance with still another embodiment of the invention.

FIGS. 10A-10E illustrate a method for forming a through-wafer interconnect for the die 220 in accordance with another embodiment of the invention. FIG. 10A shows the die 220 at a point in the process that is similar to the die 220 illustrated in FIG. 9B. The method shown in FIGS. 10A-10E, however, differs from that described above with reference to FIGS. 9A-9J in that the layers of material deposited into the blind hole 925 are different materials and a vent hole is not formed in the substrate 210. Therefore, referring to FIG. 10A, the hole or aperture 920 is formed through at least part of the substrate 210. The hole 920 extends through the terminal 232, the first dielectric layer 550, and a portion of the substrate 210 defining a blind hole 925. The hole 920 is formed by etching through the materials using one or more individual etches or a laser as described above with respect to FIG. 9B.

Figure 10B:
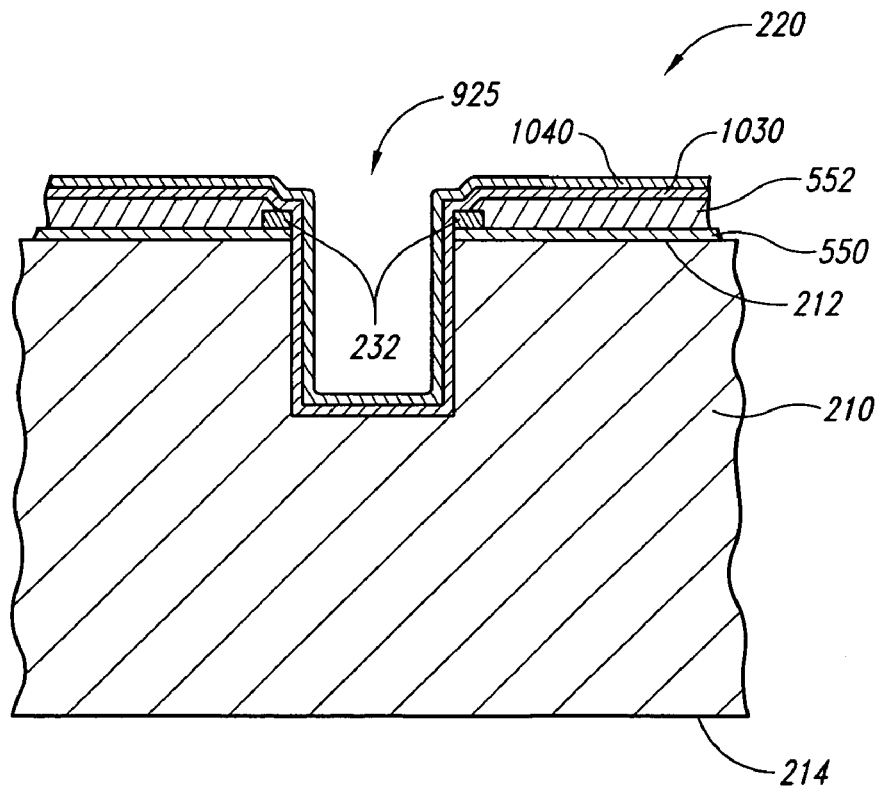

Referring next to FIG. 10B, a third dielectric layer 1030 is deposited onto the die 220 to line the sidewall of the blind hole 925 within the substrate 210. In practice, the third dielectric layer 1030 generally covers the second dielectric layer 552 and the terminal 232 in addition to lining the sidewalls of the blind hole 925. The third dielectric layer 1030 can include a furnace oxide or another suitable dielectric material described above. In this embodiment, a first conductive layer 1040 is then deposited onto the third dielectric layer 1030. The first conductive layer 1040 can be composed of TiN or other suitable materials.

Figure 10C:
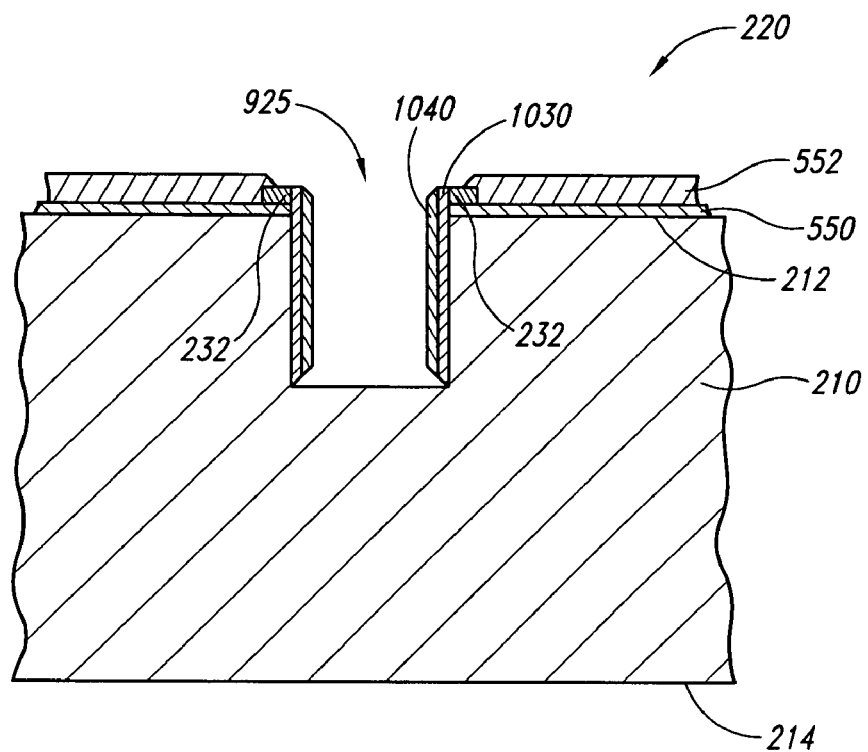

Referring next to FIG. 10C, the first conductive layer 1040 and the third dielectric layer 1030 are etched from the horizontal and diagonal surfaces of the die 220 using one or more spacer etches. This leaves a portion of the third dielectric layer 1030 lining the sidewall of the blind hole 925 and a portion of the first conductive layer 1040 on the third dielectric layer 1030. In one embodiment, the first conductive layer 1040 is etched first using a first spacer etch that does not etch the third dielectric layer 1030, and then the third dielectric layer 1030 is etched using a second spacer etch that does not etch the first conductive layer 1040 in the blind hole 925.

Figure 10D:
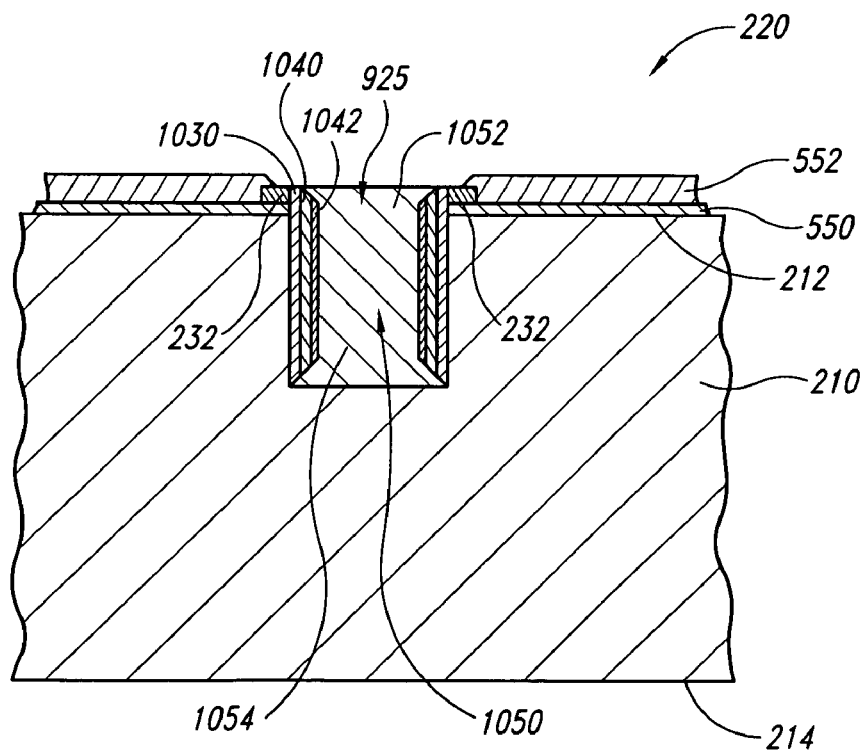

Referring next to FIG. 10D, a second conductive layer 1042 is then deposited onto the first conductive layer 1040 and the blind hole 925 is filled with a conductive material. The second conductive layer 1042 can be a wetting agent to facilitate filling the blind hole 925 with the conductive fill material. The second conductive layer 1042 can accordingly be Ni or another suitable material deposited onto the remaining portions of the first conductive layer 1040 using an electroless plating process.

A conductive fill material is then deposited into the blind hole 925 to form an interconnect 1050 in the die 220. The fill material can include a SnPb solder deposited into the blind hole 925 using a solder wave process. In alternative embodiments, the fill material may be a solder material having a different composition or another suitable electrically conductive material. Further, the fill material may be deposited into the blind hole 925 using other methods, such as plating processes, vapor deposition processes, or other suitable methods. The interconnect 1050 has a first end 1052 proximate to the terminal 232 and a second end 1054 at the bottom of the blind hole 925.

Figure 10E:
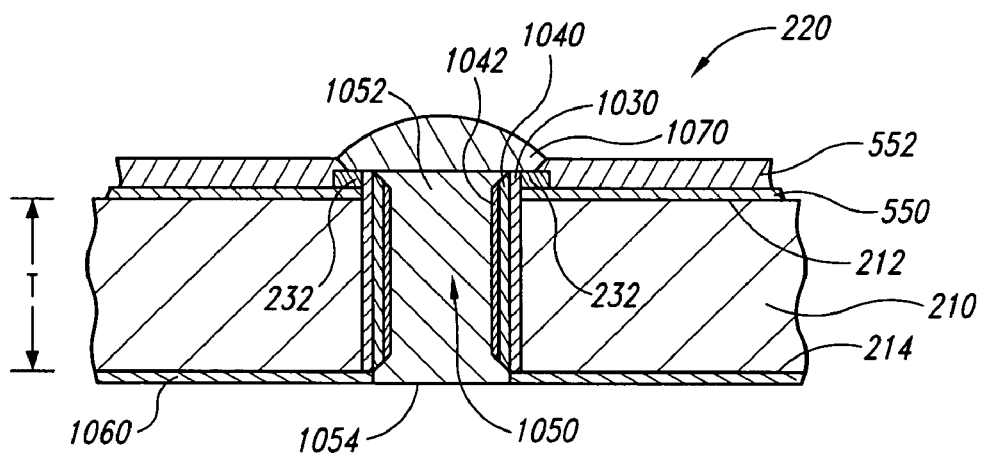

Referring to FIG. 10E, the backside 214 of the substrate 210 is then thinned using a CMP process or another suitable grinding process. The backside 214 of the substrate 210 is ground to a desired thickness "T" until the second end 1054 of the interconnect 1050 is exposed. The substrate thickness T can be approximately 200-1,000 μm, 300-750 μm, or about 500 μm. A fourth dielectric layer 1060 is applied to the backside 214 of the substrate 210 and then etched to expose the second end 1054 of the interconnect 1050, and a cap 1070 is formed on the first end 1052 of the interconnect 1050 to electrically couple the terminal 232 to the interconnect 1050.

FIGS. 11A-11H illustrate a method for forming an interconnect in a blind hole in accordance with yet another embodiment of the invention. This method begins with the substrate 210, the first dielectric layer 550, the second dielectric layer 552, and the terminal 232 as shown in FIG. 9A. A portion of the second dielectric layer 552 is removed to expose the terminal 232. The process shown in FIGS. 11A-11H, however, differs from the methods shown in FIGS. 9A-9J and FIGS. 10A-10E in that a hole or aperture is formed from the backside 214 of the substrate 210 instead of the front side 212. Before forming the blind hole, the substrate 210 can be thinned by grinding the backside of the substrate 210 to form the backside 214 to a desired thickness "T." The substrate thickness T can be approximately 200-1,000 µm, 300-750 µm, or about 500 µm. The backside 214 of the substrate 210 can be thinned using CMP processes, dry grinding processes, or other suitable grinding procedures.

After the substrate 210 is thinned to a thickness T, a third dielectric layer 1110 is applied over the backside 214 of the substrate 210. The third dielectric layer 1110 can be a polyimide material or another nonconductive material generally similar to the first and second dielectric layers 550 and 552 described above with respect to FIG. 5A. In alternate embodiments, one or more of the dielectric layers 550/552/1110 may be omitted.

Figure 11A:
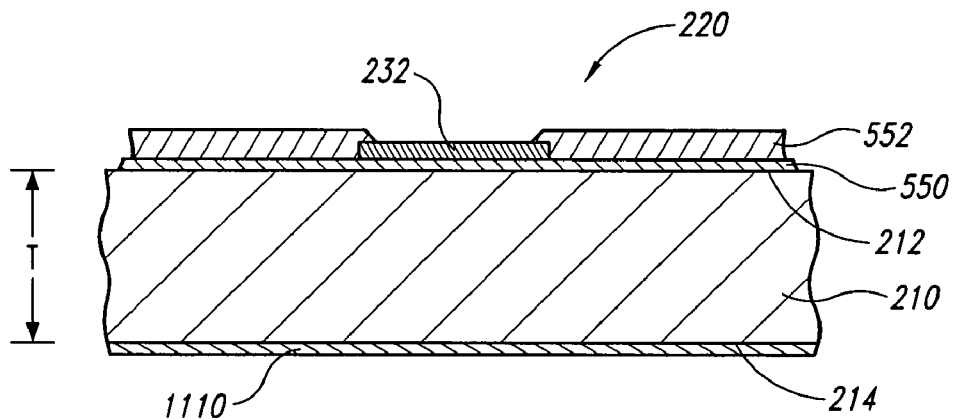
FIGS. 11A-11H are schematic side cross-sectional views illustrating a method for forming an electrically conductive through-wafer interconnect for providing a backside array of contact pads in accordance with another embodiment of the invention.
Figure 11B:
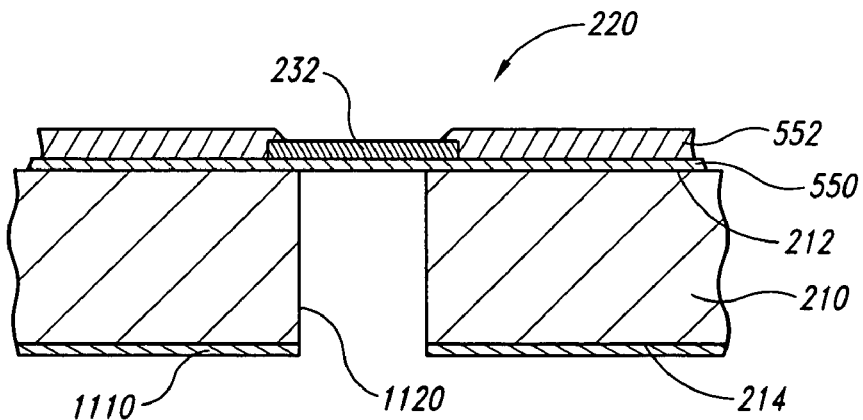

FIGS. 11B-11H illustrate subsequent stages of forming this embodiment of the interconnect. FIG. 11B, for example, is a schematic side cross-sectional view of the die 220 after a hole or aperture 1120 has been formed through the substrate 210 in alignment with a corresponding terminal 232. The hole 1120 is formed by patterning the backside 214 of the substrate 210 and etching through the substrate 210 from the backside 214. The hole 1120 can be etched using a process that selectively removes material from the substrate 210 compared to the first dielectric layer 550. The first dielectric layer 550 can accordingly be an etch-stop.

Figure 11C:
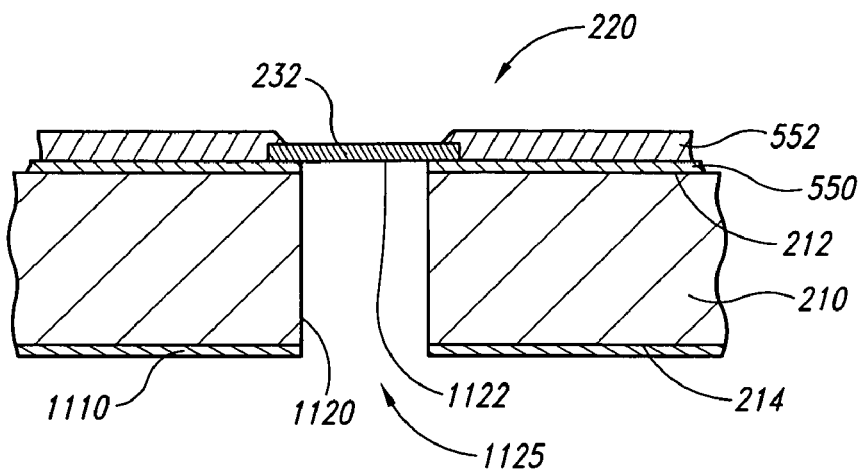

Referring to FIG. 11C, the first dielectric layer 550 directly beneath the terminal 232 is etched to expose a backside 1122 of the terminal 232. The hole 1120 and the exposed backside 1122 of the terminal 232 define a blind hole 1125. The second etching process for the first dielectric layer 550 can be different than the first etching process for the substrate 210. For example, the second etching process can selectively remove material from the first dielectric layer 550 at a higher etch rate than from either the substrate 210 or the terminal 232. The second etching process accordingly does not alter the general structure of the terminal 232 and/or the substrate 210. In an alternative embodiment, the substrate 210 and the first dielectric layer 550 can be etched using a single etch to form the hole 1120. The hole 1120 can alternatively be formed using a laser in addition to or in lieu of etching. If a laser is used to form all or a portion of the hole 1120, it is typically cleaned using chemical cleaning agents to remove slag or other contaminants as described previously.

Figure 11D:
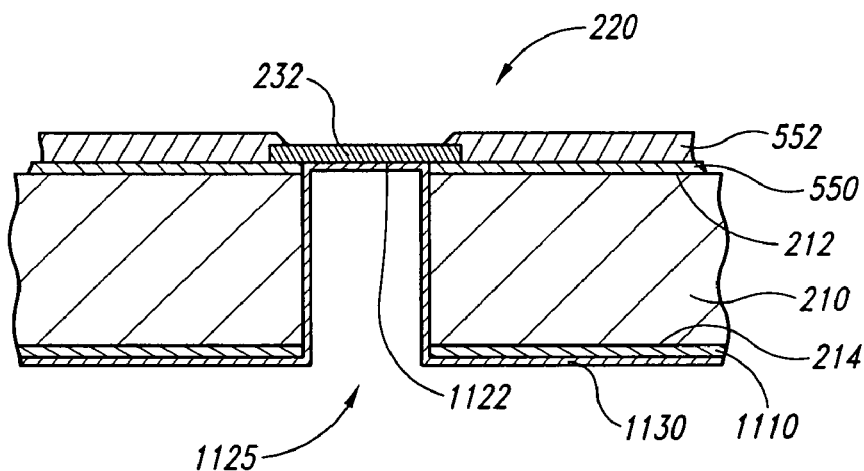
Figure 11E:
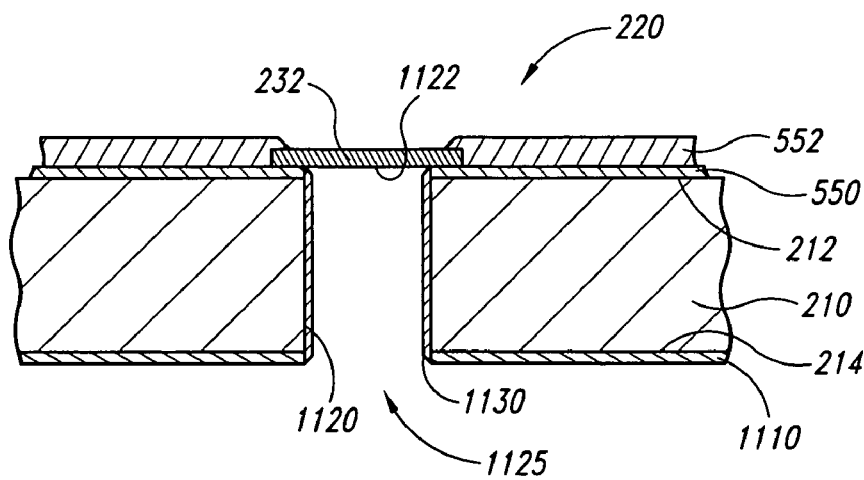

Referring to FIG. 11D, a fourth dielectric layer 1130 is applied to the die 220 to line the sidewall of the blind hole 1125. In the illustrated embodiment, the fourth dielectric layer 1130 also covers the backside 1122 of the terminal 232 and the third dielectric layer 1110. The fourth dielectric layer 1130 can be a low temperature CVD oxide or another suitable dielectric material. Referring next to FIG. 11E, the fourth dielectric layer 1130 is etched from the horizontal and diagonal surfaces of the die 220 using a spacer etch or dry etch. This leaves portions of the fourth dielectric layer 1130 lining the sidewall of the blind hole 1125 to electrically insulate components in the substrate 210 from conductive materials subsequently deposited into the blind hole 1125.

Figure 11F:
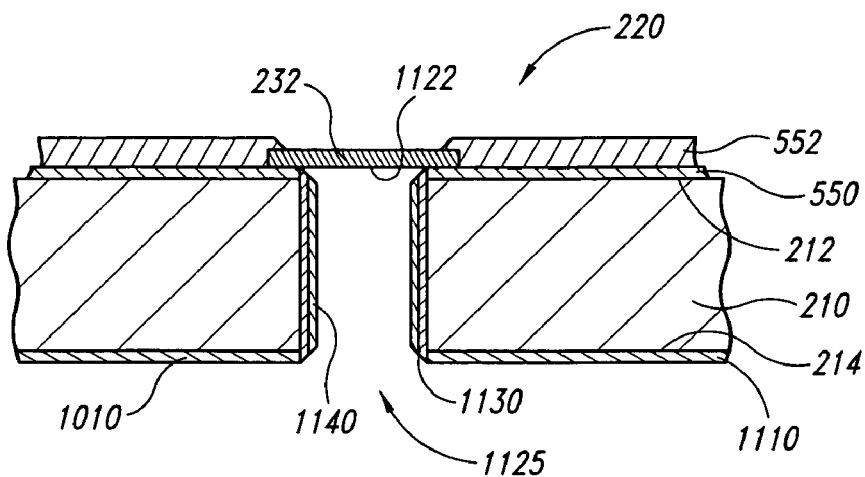

Referring next to FIG. 11F, a first conductive layer 1140 is deposited onto the die 220 and then etched to cover the portion of the fourth dielectric layer 1130 lining the sidewall of the blind hole 1125. In the illustrated embodiment, the first conductive layer 1140 is deposited over the backside 214 of the die 220 so that it covers the third dielectric layer 1110, the fourth dielectric layer 1130, and the backside 1122 of the terminal 232. The first conductive layer 1140 is generally composed of a metal, such as TiN, but in other embodiments the first conductive layer 1140 can be composed of other suitable materials. The first conductive layer 1140 is then etched from the horizontal and diagonal surfaces of the die 220 using a spacer etch to leave the remaining portions of the first conductive layer 1140 on the fourth dielectric layer 1130 in the blind hole 1125.

Figure 11G:
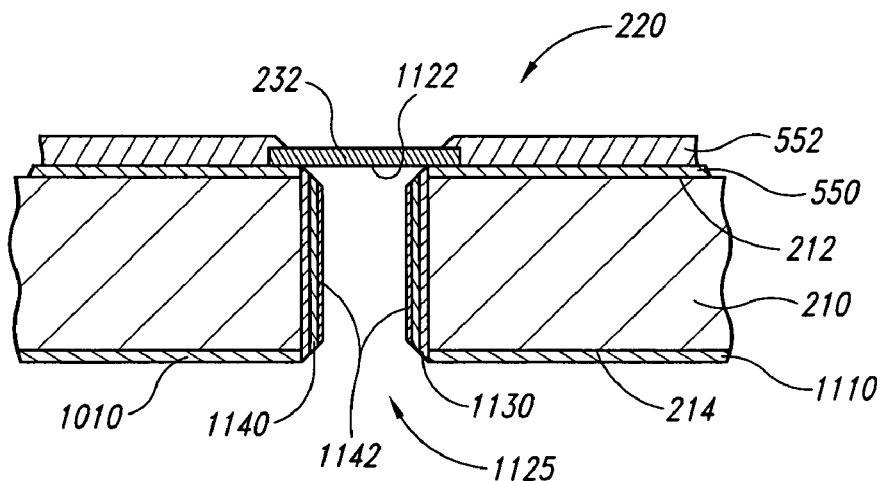

Referring to FIG. 11G, a second conductive layer 1142 is deposited onto the remaining portions of the first conductive layer 1140 in the blind hole 1125. The second conductive layer 1142 is a wetting agent that facilitates depositing subsequent metals into the blind hole 1125. The second conductive layer 1142 can be Ni that is deposited onto a first conductive layer 1140 composed of TiN in an electroless plating operation. In other embodiments, the blind hole 1125 can be coated with other suitable materials using other methods, or one or more of the first and second conductive layers 1140 and 1142 may be omitted.

Figure 11H:
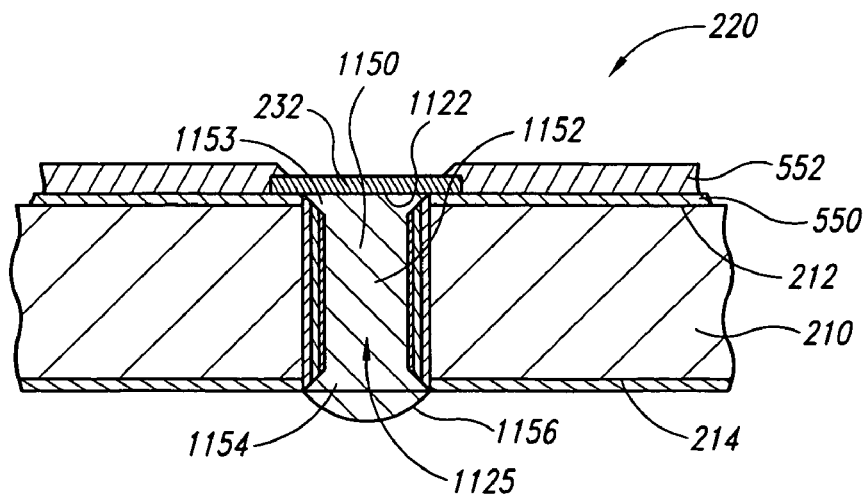

Referring next to FIG. 11H, a conductive fill material 1150 is deposited into the blind hole 1125 to form an interconnect 1152 extending through the die 220. In one embodiment, the fill material 1150 can include a SnPb solder deposited into the blind hole 1125 using a solder wave process. In alternative embodiments, the fill material 1150 may be a solder material having a different composition or another suitable electrically conductive material. Further, the fill material 1150 may be deposited into the blind hole 1125 using electroplating, electroless plating, or other suitable methods.

The interconnect 1152 has a first end 1153 contacting the backside 1122 of the terminal 232 and a second end 1154 at the backside 214 of the substrate 210. A cap 1156 can be formed at the second end 1154 of the interconnect 1152 after depositing the fill material 1150. In one embodiment, the cap 1156 can be Ni electroplated onto the interconnect 1152. In other embodiments, the cap 1156 can be a wetting agent and/or other material. A solder ball (not shown) can then be attached to the interconnect 1152 at the backside 214 of the substrate 210 to provide an external connection to other electronic devices on the backside of the die 220.

FIGS. 12A-14 illustrate several embodiments of methods for depositing conductive fill material into the blind hole 925. These methods are related to the methods described above with respect to FIGS. 9A-11H, and many reference numbers in FIGS. 12A-14 refer back to those in FIGS. 9A-11H. For example, the method shown in FIGS. 12A-12C can include several steps that are at least generally similar to those described above with respect to FIGS. 9A-9H. The subsequent stages of this method differ from those described above in that a vent hole is not formed through the substrate 210. Instead, the substrate 210 is releasably attached to a support member 1210 (e.g., a carrier substrate) that includes a first side 1212 and a second side 1214 opposite the first side 1212. The first side 1212 of the support member 1210 is releasably attached to the front side 212 of the substrate 210 with an adhesive material 1220. The support member 1210 has a vent hole 1250 substantially aligned with the blind hole 925. The vent hole 1250 can be formed either before or after the support member 1210 is attached to the substrate 210.

Figure 12A:
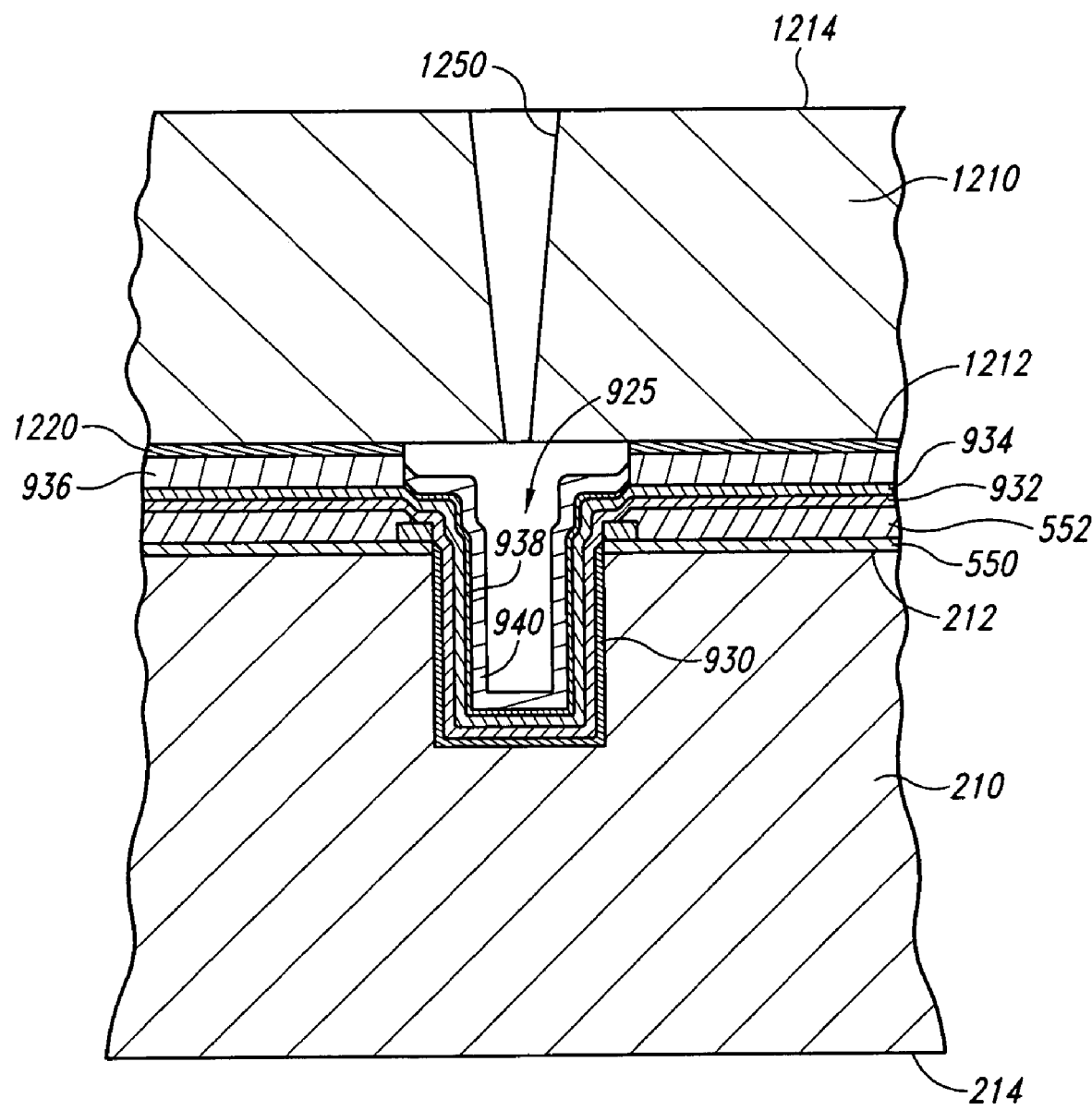
FIGS. 12A-12C are schematic side cross-sectional views illustrating stages of a method for depositing an electrically conductive fill material into a blind hole in accordance with another embodiment of the invention.
Figure 12B:
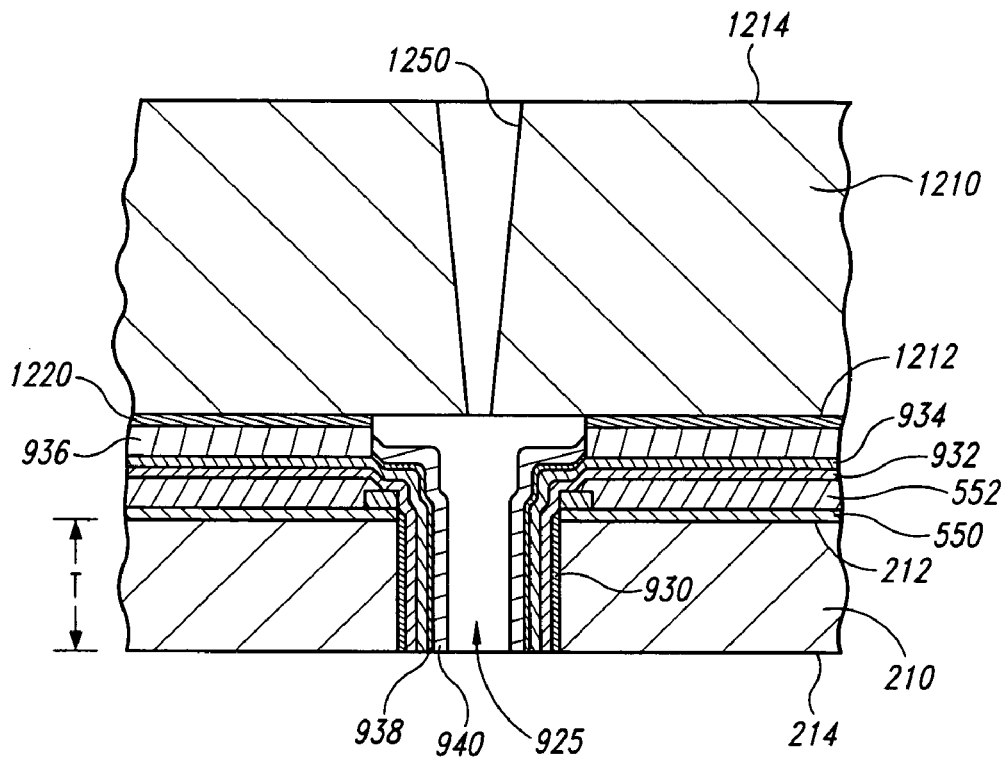
Figure 12C:
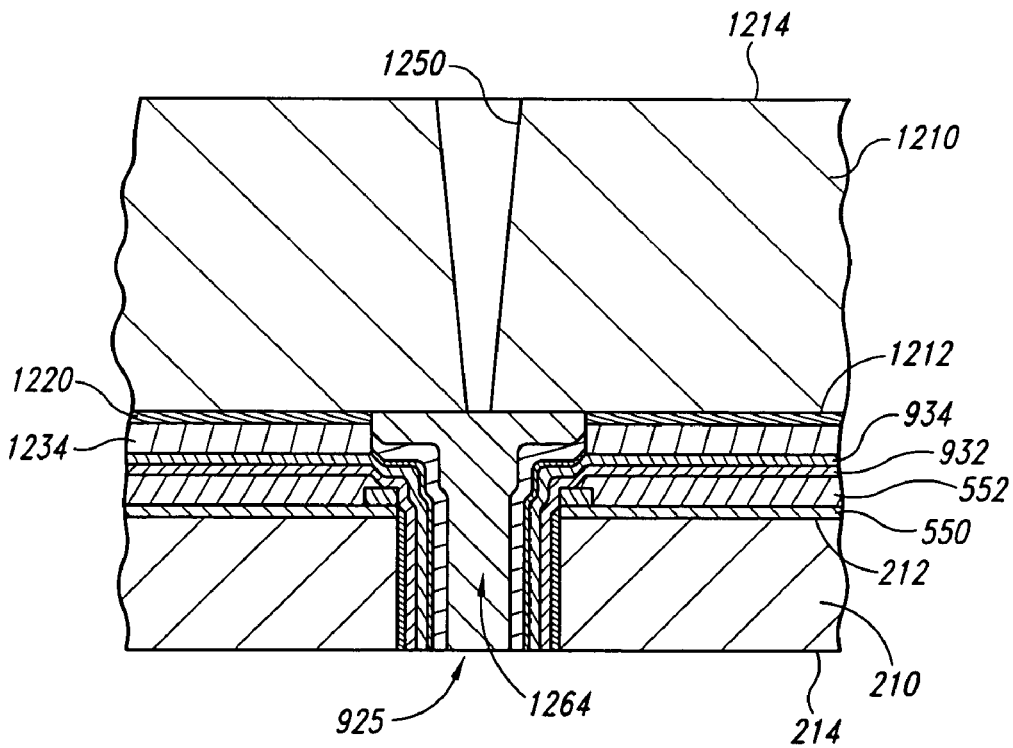

Referring next to FIG. 12B, the backside 214 of the substrate 210 is thinned until the bottom portion of the blind hole 925 is opened. The substrate 210 can be thinned using processes similar to those described above with respect to FIG. 9J. Referring to FIG. 12C, this embodiment continues by depositing a fill material into the blind hole 925 to form an interconnect 1264 extending through the substrate 210. The fill material can be a solder material, such SnAgCu solder, SnPb solder, or another solder material having a different composition. The fill material can be deposited into the blind hole 925 using a solder wave process, but in other embodiments the fill material can be deposited using plating procedures or other suitable methods.

Figure 13:
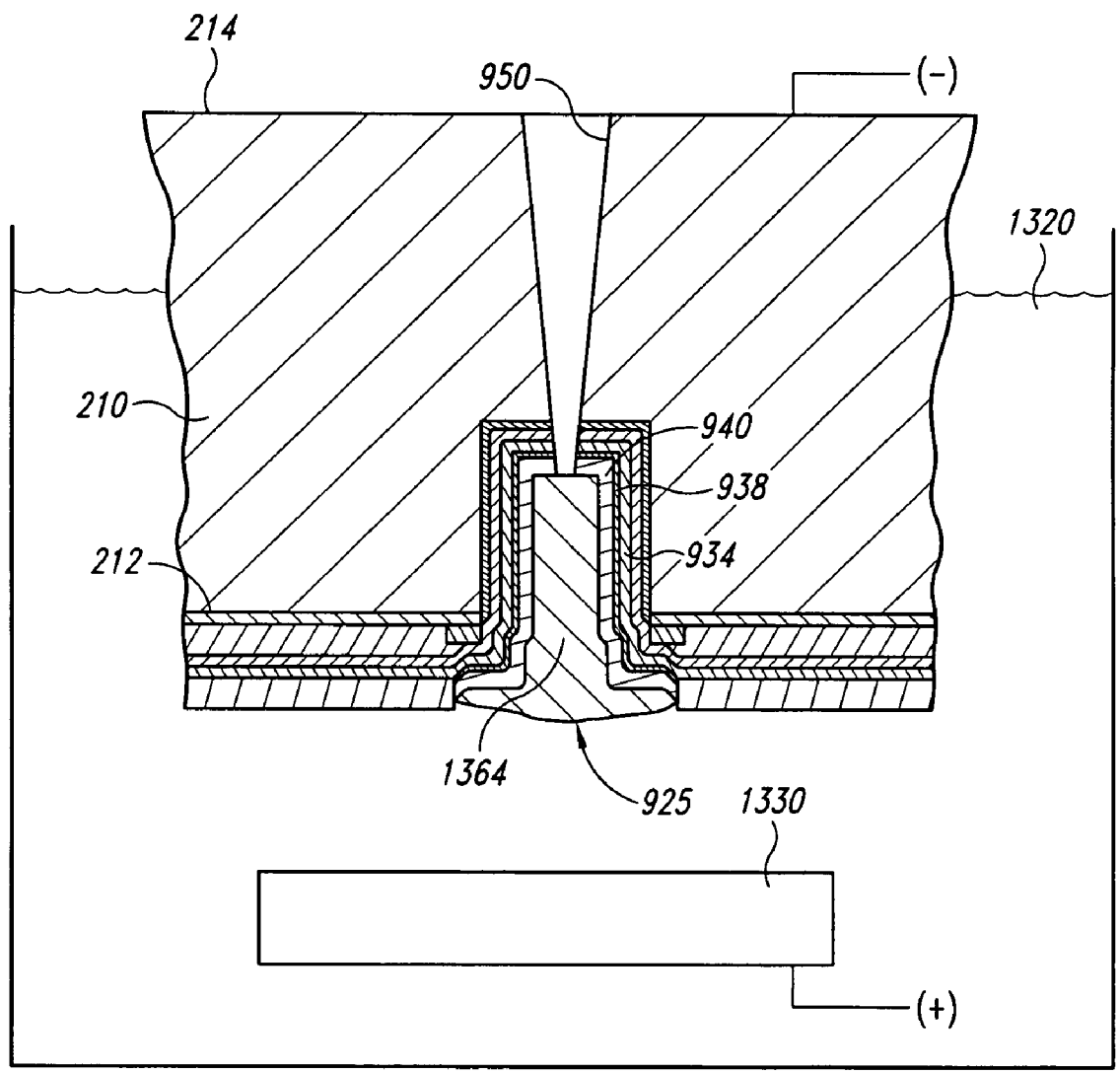
FIG. 13 is a schematic side cross-sectional view illustrating a stage of a method for depositing an electrically conductive fill material into a blind hole in accordance with yet another embodiment of the invention.

FIG. 13 illustrates a method for filling the blind hole 925 using a plating process. This method can include several steps similar to those described above with respect to FIGS. 9A-9E. The subsequent stages of this method, however, may differ from those described above in that the fill material is plated into the blind hole 925 using a bottom-up plating process that selectively fills the blind hole 925 with fill material. In the illustrated embodiment, for example, the substrate 210 can conduct electrical current to the seed layer 934 or other conductive material (e.g., conductive layers 936 and 938) in the blind hole 925. In another embodiment, the conductive layers 936 and 938 may not be deposited onto the seed layer 934. This embodiment continues by applying an electrical potential to the backside 214 of the substrate 210 and an electrode 1330 immersed in a plating solution 1320. An electrical current accordingly passes through the substrate 210 such that the ions in the plating solution 1320 plate onto the seed layer 934 and progressively plate onto each other to fill the blind hole 925 and form an interconnect 1364. The plating process can be terminated when the blind hole 925 is either fully or partially filled with the fill material. The substrate 210 can then undergo further processing as described above in FIGS. 9I and 9J.

Figure 14:
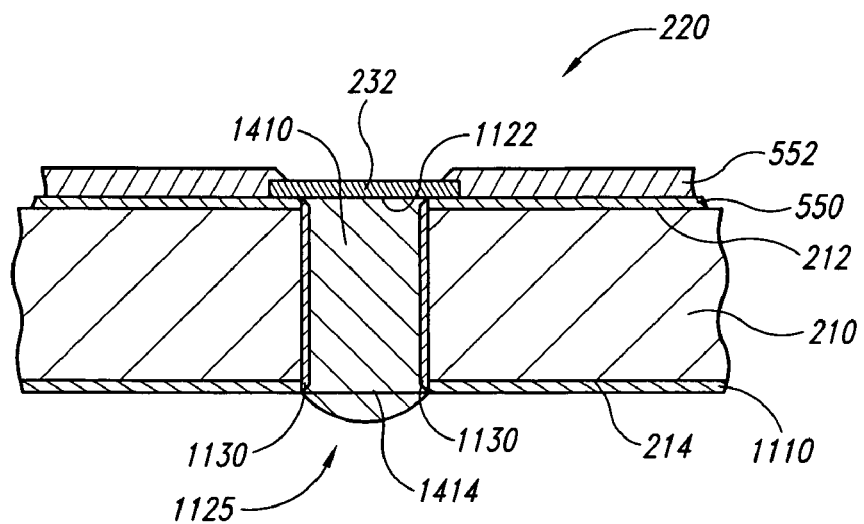
FIG. 14 is a schematic side cross-sectional view illustrating a stage of a method for depositing an electrically conductive fill material into a blind hole in accordance with still another embodiment of the invention.

FIG. 14 illustrates an interconnect 1410 in the die 220 in accordance with another embodiment of the invention. This method differs from the embodiment described above with reference to FIGS. 11F-11H in that a first conductive layer and a second conductive layer are not deposited into the blind hole 1125. Instead, a fill material is plated into the blind hole 1125 using a bottom-up plating process. The plating process can be an electroless or an electrolytic process. In an electrolytic process, for example, a conductive member (not shown) is pressed against the upper side of the terminal 232 while the backside 1122 of the terminal 232 contacts a plating solution (not shown). A potential is applied between the conductive member and the plating solution to plate ions in the solution onto the backside 1122 of the terminal 232. The ions will continue to plate onto each other in a bottom-up manner until the fill material fills the blind hole 1125. The die 220 is then removed from the plating bath and the fill material remains in the blind hole 1125 thus forming the interconnect 1410. The interconnect 1410 can accordingly have a backside end 1414 upon which a solder ball (not shown) can be deposited or other features can be formed.

F. Embodiments of Microelectronic Devices

Figure 15:
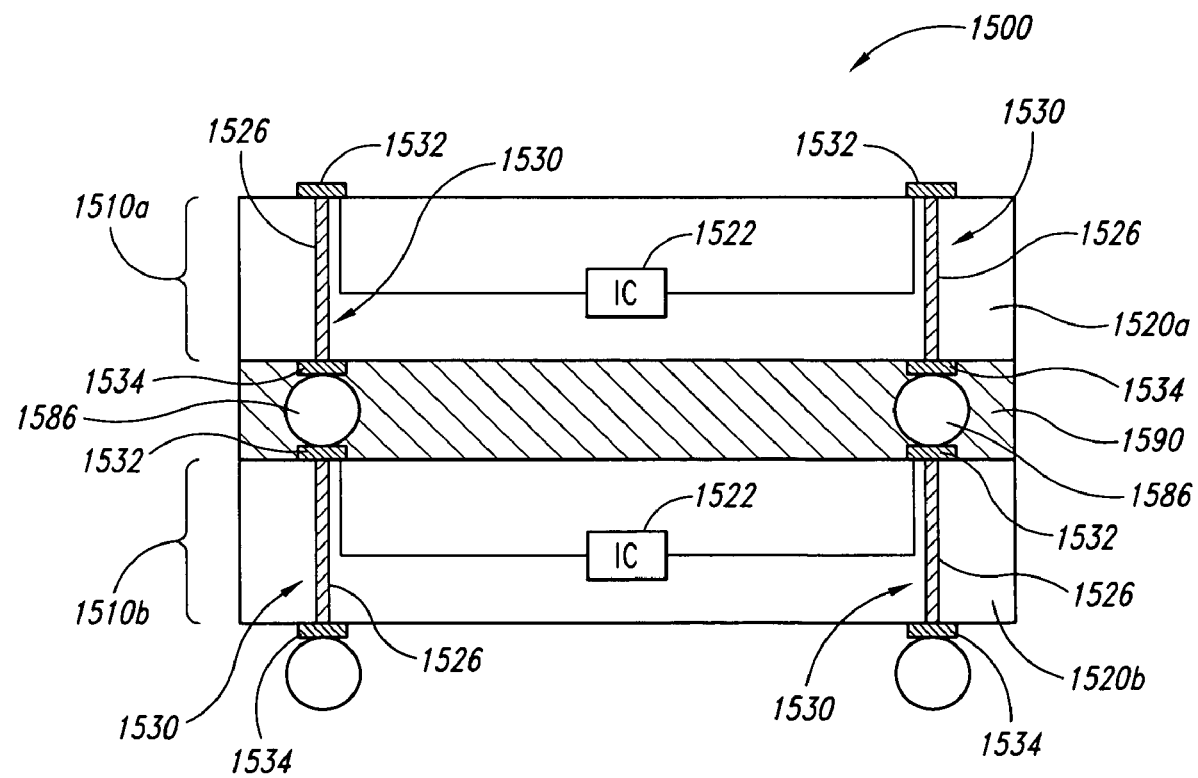
FIG. 15 is a schematic side cross-sectional view of a packaged microelectronic device in accordance with one embodiment of the invention.

FIG. 15 is a schematic side cross-sectional view of a microelectronic device 1500 configured in accordance with an embodiment of the invention. In one aspect of this embodiment, the microelectronic device 1500 includes a plurality of microelectronic devices 1510 (individually identified as a first microelectronic device 1510a and a second microelectronic device 1510b) interconnected in a stacked-die arrangement. The first and second microelectronic dies 1510a and 1510b can have many components at least generally similar to the microelectronic dies 220 discussed above and illustrated in FIG. 2. For example, the first microelectronic device 1510a can include a first microelectronic die 1520a having an integrated circuit 1522 and external contacts 1530 electrically coupled to the integrated circuit 1522. The external contacts 1530 in the illustrated embodiment include a terminal 1532 (e.g., a bond-pad), an external contact 1534 (e.g., a ball-pad), and an interconnect 1526 extending through the die 1520a coupling the terminal 1532 to the contact pad 1534. The interconnect 1526 can be constructed using any of the methods described above with respect to FIGS. 3-14. The second microelectronic device 1510b can include generally similar components as the first microelectronic device 1510a.

In the illustrated embodiment, a plurality of solder balls 1586 are coupled to corresponding contact pads 1534 at the backside of the individual devices 1510. Accordingly, the solder balls 1586 can be used to electrically connect the first microelectronic device 1510a to the second microelectronic device 1510b. A suitable underfill material 1590 or other compound can also be used to structurally attach the microelectronic devices 1510 together in the illustrated stacked-die configuration. Additionally, the solder balls 1586 at the backside of the second device 1510b can in turn be used to electrically connect the microelectronic device 1500 to another external device or board.

One feature of the embodiments illustrated in FIG. 15 is that the respective first and second microelectronic devices 1510a and 1510b are electrically connected without the need for wire-bonds. One advantage of this feature is that the added cost and complexity of wire-bonds is avoided. A further advantage of this feature is that the footprint of the microelectronic device 1500 can be reduced over conventional stacked devices having wire-bond interconnections.

From the foregoing, it will be appreciated that specific embodiments of the invention have been described herein for purposes of illustration, but that various modifications may be made without deviating from the spirit and scope of the invention. Various aspects of any of the foregoing embodiments can be combined in different combinations. For example, any of the methods for forming interconnects in through-holes extending through the workpiece described above can be used to form interconnects in blind holes. Likewise, any of the methods for forming interconnects in blind holes described previously can be used to form interconnects in through-holes. Accordingly, the invention is not limited except as by the appended claims.

I claim:

1. A method for manufacturing a microelectronic workpiece, the workpiece including a microelectronic substrate having a front side, a backside, and a plurality of microelectronic dies, the individual dies including an integrated circuit and a plurality of terminals operatively coupled to the integrated circuit, the method comprising:

forming a blind hole in the substrate in alignment with one of the terminals, the blind hole extending from the front side of the substrate to an intermediate depth in the substrate;

applying an isolation material to at least a portion of the blind hole, wherein the isolation material is applied using a pulsed layer deposition process;

constructing an electrically conductive interconnect in at least a portion of the blind hole by depositing a solder material into the blind hole and in electrical contact with the terminal; and removing material from the backside of the substrate to thin the substrate either before or after forming the blind hole.

2. The method of claim 1 wherein forming a blind hole comprises etching a hole into the substrate such that the hole does not extend completely through the substrate.

3. The method of claim 1 wherein forming a blind hole comprises laser cutting a hole into the substrate such that the hole does not extend completely through the substrate.

4. The method of claim 1 wherein depositing a solder material comprises depositing a SnAgCu solder, a SnPb solder, and/or a AuSn solder.

5. The method of claim 1 wherein depositing a solder material comprises depositing the solder material using a vacuum reflow process, solder wave process, plating process, screen printing process, vapor deposition process, placing a pre-formed sphere of solder in the hole and melting the solder, and/or injecting a solder paste or molten solder into the blind hole.

6. The method of claim 1 wherein:
applying an isolation material comprising applying a low temperature CVD oxide using a pulsed layer deposition process; and
depositing a solder material comprises depositing a SnAgCu solder using a vacuum reflow process.

7. The method of claim 1 wherein:
applying an isolation material comprising applying a low temperature silane-based oxide; and
depositing a solder material comprises depositing a SnPb solder.

8. The method of claim 1, further comprising:
depositing a barrier layer into the blind hole over at least a portion of the isolation material; and
depositing a wetting agent into the blind hole over at least a portion of the barrier layer before depositing the solder material into the blind hole.

9. The method of claim 8, further comprising removing material from a backside of the workpiece to thin the substrate before forming the blind hole.

10. The method of claim 8, further comprising removing material from a backside of the workpiece to thin the substrate after constructing the interconnect.

11. The method of claim 1, further comprising:
depositing a barrier layer into the blind hole over at least a portion of the isolation material, wherein the barrier layer includes W and/or Ta; and
applying a wetting agent into the blind hole over at least a portion of the isolation material using an electroplating process before depositing the solder material into the blind hole, wherein the wetting agent includes Ni.

12. The method of claim 1, further comprising:
depositing a barrier layer into the blind hole over at least a portion of the isolation material;
depositing a seed layer onto the substrate and into the blind hole over the barrier layer;
applying a layer of resist over the workpiece and forming an aperture over the terminal; and
applying a conductive layer into the blind hole and over at least a portion of the seed layer before depositing the solder material into the blind hole.

13. The method of claim 12, further comprising removing the layer of resist, seed layer, and barrier layer from at least a portion of the substrate outside the blind hole after constructing the interconnect.

14. The method of claim 12 wherein the conductive layer is a second conductive layer, and wherein the method further comprises applying a first conductive layer into the blind hole and over the seed layer after applying the layer of resist and before applying the second conductive layer.

15. The method of claim 1, further comprising:
depositing a barrier layer onto the substrate and into the blind hole over at least a portion of the isolation material, wherein the barrier layer includes W and/or Ta;
depositing a seed layer onto the substrate and into the blind hole, the seed layer covering at least a portion of the barrier layer, wherein the seed layer includes Cu;
enhancing the seed layer;
applying a layer of resist over the substrate and forming an aperture over the terminal;
applying a conductive layer into at least a portion of the blind hole using an electroplating process, wherein the conductive layer includes Cu;
depositing a wetting agent over at least a portion of the conductive layer before depositing a solder material into the blind hole, wherein the wetting agent includes Ni; and
removing the layer of resist, seed layer, and barrier layer from at least a portion of the substrate outside the blind hole after depositing the solder material into the blind hole.

16. The method of claim 15, further comprising removing material from a backside of the workpiece to thin the substrate before forming the blind hole.

17. The method of claim 15, further comprising removing material from a backside of the workpiece to thin the substrate after constructing the interconnect.

18. The method of claim 1, further comprising forming a vent hole in the substrate before depositing the solder material into the blind hole, the vent hole being in fluid communication with the blind hole such that gases or fluids can flow from the blind hole to the vent hole.

* * * * *